US012703044B2

(12) United States Patent
Lee et al.

(10) Patent No.: US 12,703,044 B2
(45) Date of Patent: Aug. 11, 2026

(54) SOLDERING DEVICE INCLUDING PULSED LIGHT IRRADIATOR, SOLDERING METHOD USING PULSED LIGHT IRRADIATION, AND METHOD OF MANUFACTURING SEMICONDUCTOR PACKAGE

(71) Applicant: Samsung Electronics Co., Ltd., Suwon-si (KR)

(72) Inventors: Sinyeop Lee, Suwon-si (KR); Taegyu Kang, Suwon-si (KR); Jaeseon Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 436 days.

(21) Appl. No.: 18/322,774

(22) Filed: May 24, 2023

(65) Prior Publication Data

US 2024/0128230 A1 Apr. 18, 2024

(30) Foreign Application Priority Data

Oct. 14, 2022 (KR) ........................ 10-2022-0132717

(51) Int. Cl.
*B23K 26/062* (2014.01)
*B23K 26/03* (2006.01)
(Continued)

(52) U.S. Cl.
CPC ........ *B23K 26/0626* (2013.01); *B23K 26/034* (2013.01); *B23K 26/0622* (2015.10);
(Continued)

(58) Field of Classification Search
CPC .... B23K 1/005; B23K 1/0056; B23K 26/034; B23K 26/0622; B23K 26/0626;
(Continued)

(56) References Cited

U.S. PATENT DOCUMENTS 6,606,537 B1 8/2003 Kazmierowicz et al.
7,748,594 B2 7/2010 Yamamoto et al.
(Continued)

FOREIGN PATENT DOCUMENTS

JP 2019-110014 A 7/2019
KR 10-1548425 B1 8/2015
KR 10-2020-0072432 A 6/2020

OTHER PUBLICATIONS

Korean Office Action dated May 13, 2026 for corresponding Korean Patent Application No. 10-2022-0132717 and English-language translation thereof.

*Primary Examiner* — Wael M Fahmy
*Assistant Examiner* — Shamita S Hanumasagar
(74) *Attorney, Agent, or Firm* — HARNESS, DICKEY & PIERCE, P.L.C.

(57) ABSTRACT

A soldering device includes a control unit to predict a final rise temperature of an electronic device, based on power of a light pulse from at least one pulsed light irradiator, a weight of the electronic device, a real-time temperature of the electronic device, the quantity of exposures of the light pulse, and an irradiation period of the light pulse, and change a condition of the light pulse, based on a predicted result. A soldering method includes calculating power of the light pulse based on a time width of the light pulse, measuring a temperature of the electronic device, and predicting a final rise temperature of the electronic device, based on the calculated power, a weight of the electronic device, the measured temperature, the quantity of exposures of the light pulse, and the irradiation period.

15 Claims, 20 Drawing Sheets

(51) Int. Cl.

| | |
|---|---|
| ***B23K 26/0622*** | (2014.01) |
| ***B23K 26/12*** | (2014.01) |
| ***H10B 80/00*** | (2026.01) |
| ***H10W 72/00*** | (2026.01) |
| ***H10W 72/20*** | (2026.01) |
| ***H10W 90/00*** | (2026.01) |
| ***H10W 90/20*** | (2026.01) |

(52) U.S. Cl.
CPC ........... *B23K 26/127* (2013.01); *H10B 80/00* (2023.02); *H10W 90/00* (2026.01); *H10W 72/07141* (2026.01); *H10W 72/07183* (2026.01); *H10W 72/072* (2026.01); *H10W 72/07231* (2026.01); *H10W 72/07235* (2026.01); *H10W 72/07236* (2026.01); *H10W 72/225* (2026.01); *H10W 72/252* (2026.01); *H10W 90/291* (2026.01); *H10W 90/297* (2026.01); *H10W 90/722* (2026.01); *H10W 90/724* (2026.01)

(58) Field of Classification Search
CPC ..... B23K 26/127; B23K 1/0016; H01L 24/75; H01L 2224/75; H01L 2224/75101; H01L 2224/75261; H01L 2224/759; H01L 2224/81224; H01L 2224/8123; H01L 2224/81801; H01L 2224/81815; H01L 2224/81908; H10W 72/0198; H10W 72/07141; H10W 72/07173; H10W 72/07183; H10W 72/07236; H10W 90/00
See application file for complete search history.

(56) References Cited

U.S. PATENT DOCUMENTS

| | | | |
|---|---|---|---|
| 10,211,195 | B2 | 2/2019 | Kajiyama |
| 11,166,351 | B2 | 11/2021 | Lee et al. |
| 2009/0127235 | A1 | 5/2009 | Wei et al. |
| 2009/0214193 | A1 | 8/2009 | Suzuki et al. |
| 2019/0229085 | A1 | 7/2019 | Arutinov et al. |
| 2020/0221581 | A1 | 7/2020 | Wu et al. |
| 2021/0185831 | A1 | 6/2021 | Rahimi et al. |
| 2022/0015213 | A1 | 1/2022 | Kitagawa et al. |

100
192
INPUT UNIT
190
CONTROL UNIT
102
104
170
TEMPERATURE SENSOR
160
154
150
152
LT
WP
140
134
130
110
WEIGHT SENSOR
EX1
140
140
180
123
EXHAUST
120
125

FIG. 7

SOLDERING DEVICE INCLUDING PULSED LIGHT IRRADIATOR, SOLDERING METHOD USING PULSED LIGHT IRRADIATION, AND METHOD OF MANUFACTURING SEMICONDUCTOR PACKAGE

CROSS-REFERENCE TO RELATED APPLICATION

This application is based on and claims priority under 35 U.S.C. § 119 to Korean Patent Application No. 10-2022-0132717, filed on Oct. 14, 2022, in the Korean Intellectual Property Office, the disclosure of which is incorporated by reference herein in its entirety.

BACKGROUND

The inventive concepts relate to soldering devices, soldering methods, and methods of manufacturing a semiconductor package, and more particularly, soldering devices including a pulsed light irradiator, soldering methods using pulsed light irradiation, and methods of manufacturing a semiconductor package.

In surface mount technology (SMT) for mounting various electronic devices, such as a transistor, a diode, a resistor, and an integrated circuit (IC) chip, on a printed circuit board (PCB), it is necessary to develop techniques capable of optimizing soldering conditions and improving productivity according to variations in the thermal capacity and/or temperature of each of the electronic devices.

SUMMARY

Some example embodiments of the inventive concepts provide a soldering device, which may optimize soldering conditions during the mounting of electronic devices and improve productivity.

Some example embodiments of the inventive concepts may provide a soldering method, which may optimize soldering conditions during the mounting of electronic devices and improve productivity.

Some example embodiments of the inventive concepts may provide a method of manufacturing a semiconductor package, which may optimize soldering conditions during the mounting of electronic devices and improve productivity.

According to some example embodiments of the inventive concepts, a soldering device may include a soldering chamber, a transfer device arranged in the soldering chamber to be capable of moving in a linear movement scheme, at least one pulsed light irradiator configured to irradiate intense pulsed light (IPL) to a workpiece including an electronic device on the transfer device, and a control unit configured to predict a final rise temperature of the electronic device, based on power of a light pulse generated by the at least one pulsed light irradiator, a weight of the electronic device, a temperature of the electronic device, a quantity of exposures of the light pulse, and an irradiation period of the light pulse, and change at least one of the power of the light pulse, a time width of the light pulse, or the irradiation period of the light pulse, based on a predicted result of the final rise temperature.

According to some example embodiments of the inventive concepts, there a soldering method may include loading a workpiece into a soldering chamber including at least one pulsed light irradiator, the workpiece including a main substrate, an electronic device on the main substrate, and a solder material layer between the main substrate and the electronic device. The method may include setting a time width of a light pulse from the at least one pulsed light irradiator and an irradiation period of the light pulse. The method may include calculating a power of the light pulse based on the time width of the light pulse. The method may include measuring a temperature of the electronic device in the soldering chamber. The method may include predicting a final rise temperature of the electronic device, based on the calculated power of the light pulse, a weight of the electronic device, the measured temperature of the electronic device, a quantity of exposures of light pulses to the electronic device, and an irradiation period of the light pulse. The method may include changing at least one of the power of the light pulse, the time width of the light pulse, or the irradiation period of the light pulse in response to a determination that the predicted final rise temperature of the electronic device deviates from a particular temperature range.

According to some example embodiments of the inventive concepts, a soldering method may include sequentially loading a plurality of workpieces into a soldering member including at least one pulsed light irradiator in a linear movement scheme, each workpiece including a main substrate, an electronic device on the main substrate, and a solder material layer between the main substrate and the electronic device. The method may include setting a time width of a light pulse from the at least one pulsed light irradiator and an irradiation period of the light pulse. The method may include calculating a power Ep of the light pulse is calculated according to Equation 1:

$$E_P = \frac{V^3 t_P}{K_0^2} \qquad \text{[Equation 1]}$$

Wherein, in Equation 1, V denotes a charging voltage of the pulsed light irradiator, tp denotes a time width of the light pulse, and $K_0$ denotes an impedance of the pulsed light irradiator.

The method may include measuring a temperature of the electronic device included in each of the plurality of workpieces in the soldering chamber. The method may include predicting a rise temperature ΔT of the electronic device according to Equation 2:

$$\Delta T = \sum_{n=1}^{N} \frac{E_P}{cM} - (aT + b)(1/f) \qquad \text{[Equation 2]}$$

Wherein, in Equation 2, c denotes a specific heat of the electronic device, M denotes a weight of the electronic device, T denotes the temperature of the electronic device, which is measured in real time in the soldering chamber immediately before subsequent irradiation of pulsed light, f denotes an irradiation period of the light pulse, each of a and b denotes a particular (or, alternatively, predetermined) constant that determines a temperature attenuation function represented by "aT+b," and N denotes a quantity of exposures of light pulses to the electronic device.

The method may include changing at least one of the power of the light pulse, the time width of the light pulse, or the irradiation period of the light pulse in response to a determination that a predicted final rise temperature ΔT of the electronic device deviates from a particular temperature range. The method may include applying a single light pulse to each of the plurality of workpieces by using the at least one pulsed light irradiator under setting conditions used to predict the final rise temperature ΔT of the electronic device, in response to a determination that the predicted final rise temperature ΔT of the electronic device is within the particular temperature range.

According to some example embodiments of the inventive concepts, a method of manufacturing a semiconductor package may include forming a plurality of workpieces by arranging a plurality of electronic devices on a main substrate. The plurality of electronic devices may be bonded onto the main substrate by using the soldering method according to the inventive concepts.

BRIEF DESCRIPTION OF THE DRAWINGS

Example embodiments of the inventive concepts will be more clearly understood from the following detailed description taken in conjunction with the accompanying drawings in which:

FIG. 7 is a diagram of a configuration of a soldering device according to some example embodiments;

DETAILED DESCRIPTION

Figure 1:
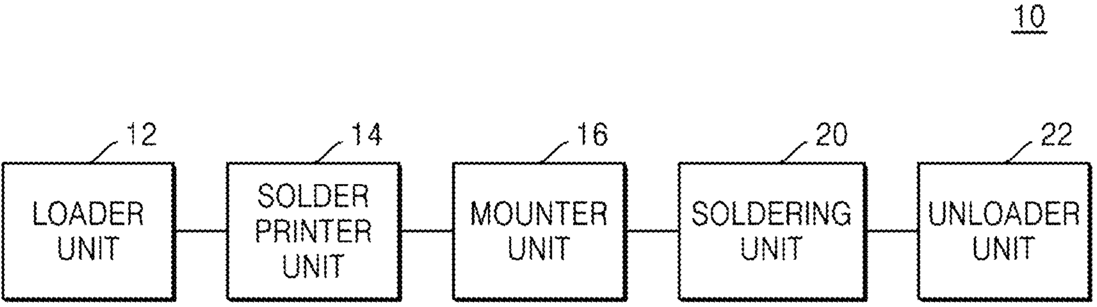
FIG. 1 is a block diagram of a surface mounting device according to some example embodiments.

Hereinafter, some example embodiments will be described in detail with reference to the accompanying drawings. The same reference numerals are used to denote the same elements in the drawings, and repeated descriptions thereof are omitted.

Hereinafter, the terms "above" or "on" may include not only those that are directly on in a contact manner, but also those that are above in a non-contact manner. The singular forms "a," "an," and "the" as used herein are intended to include the plural forms as well unless the context clearly indicates otherwise. It will be understood that the terms "comprise," "include," or "have" as used herein specify the presence of stated elements, but do not preclude the presence or addition of one or more other elements.

The use of the term "the" and similar demonstratives may correspond to both the singular and the plural. Operations constituting methods may be performed in any suitable order unless otherwise indicated herein or otherwise clearly contradicted by context, and are not necessarily limited to the stated order.

The use of all illustrations or illustrative terms in some example embodiments is simply to describe the technical ideas in detail, and the scope of the present inventive concepts is not limited by the illustrations or illustrative terms unless they are limited by claims.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular", "substantially parallel", or "substantially coplanar" with regard to other elements and/or properties thereof will be understood to be "perpendicular", "parallel", or "coplanar", respectively, with regard to the other elements and/or properties thereof within manufacturing tolerances and/or material tolerances and/or have a deviation in magnitude and/or angle from "perpendicular", "parallel", or "coplanar", respectively, with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same. While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed, or an effect such as a structure is described to be established "by" or "through" performing additional operations, it will be understood that the operation may be performed and/or the effect/structure may be established "based on" the additional operations, which may include performing said additional operations alone or in combination with other further additional operations.

As described herein, an element that is described to be "spaced apart" from another element, in general and/or in a particular direction (e.g., vertically spaced apart, laterally spaced apart, etc.) and/or described to be "separated from" the other element, may be understood to be isolated from direct contact with the other element, in general and/or in the particular direction (e.g., isolated from direct contact with the other element in a vertical direction, isolated from direct contact with the other element in a lateral or horizontal direction, etc.). Similarly, elements that are described to be "spaced apart" from each other, in general and/or in a particular direction (e.g., vertically spaced apart, laterally spaced apart, etc.) and/or are described to be "separated" from each other, may be understood to be isolated from direct contact with each other, in general and/or in the particular direction (e.g., isolated from direct contact with each other in a vertical direction, isolated from direct contact with each other in a lateral or horizontal direction, etc.). Similarly, a structure described herein to be between two other structures to separate the two other structures from each other may be understood to be configured to isolate the two other structures from direct contact with each other.

FIG. 1 is a block diagram of a surface mounting device 10 according to some example embodiments.

Referring to FIG. 1, the surface mounting device 10 may include a loader unit 12, a solder printer unit 14, a mounter unit 16, a soldering unit 20, and an unloader unit 22, which are connected to each other in a linear movement scheme, for example such that the loader unit 12, the solder printer unit 14, the mounter unit 16, the soldering unit 20, and the unloader unit 22 are aligned with, and at least partially overlap with each other in an axis extending in a particular direction.

The loader unit 12 may transfer a main substrate (e.g., a printed circuit board (PCB) to the solder printer unit 14. The unloader unit 22 may discharge the resultant structure in which electronic devices are soldered on the main substrate, to the outside of the surface mounting device 10.

The solder printer unit 14 may coat and print a solder material layer (e.g., a solder material layer 134 shown in FIG. 2) on the main substrate to correspond to the arrangement of connection patterns of the main substrate or the arrangements of terminals included in the electronic devices to be bonded onto the main substrate. The main substrate on which the solder material layer is printed may be transferred to the mounter unit 16. The mounter unit 16 may be configured such that various electronic devices are arranged at designed positions on the main substrate on which the solder material layer is printed.

A resultant structure (hereinafter, a "workpiece") in which the electronic devices are on the main substrate may be transferred to the soldering unit 20. The soldering unit 20 may include at least one pulsed light irradiator configured to irradiate pulsed light to the electronic devices located on the main substrate. As used herein, "pulsed light" may refer to light beams that are modulated into a series of individual spikes having a relatively high intensity.

In some example embodiments, the at least one pulsed light irradiator may generate intense pulsed light (IPL). In some example embodiments, the at least one pulsed light irradiator may include a xenon flash lamp. A wavelength of the xenon flash lamp may be in a range of about 185 nm to about 2000 nm or a range of about 400 nm to about 1200 nm. The IPL may irradiate multi-wavelength light over a large area and enable local selective heating by exposing short pulses with high intensity. A frequency of the IPL may be in a range of about 2 Hz to about 4 Hz. A pulse width of the IPL may be selected in a range of about 0.1 ms to about 10 ms, for example, a range of about 2 ms to about 4 ms, without being limited thereto. The pulse width of the IPL may be variously selected according to types and physical properties of the electronic devices located on the main substrate and/or types of the solder material layer. While the resultant structure in which the electronic devices are on the main substrate is passing through the soldering unit 20, the number (e.g., quantity) of times IPL is irradiated to the electronic device may be about 6 times to about 300 times, for example, about 10 times to about 30 times, without being limited thereto. The number of times IPL is irradiated to the electronic device may be variously selected according to types and physical properties of electronic devices on the main substrate and/or types of the solder material layer.

In the soldering unit 20, the solder material layer may be heated to a desired target temperature by using the at least one pulsed light irradiator. The solder material layer between the connection patterns of the main substrate and the electronic devices may be heated to the desired target temperature by using pulsed light irradiations and cooled between a plurality of pulsed light irradiations. The heating process and the cooling process may be repeated a plurality of times. Thus, as the solder material layer is cured, the electronic devices may be bonded to the main substrate to enable electrical connection between the electronic devices and the main substrate.

In some example embodiments, the surface mounting device 10 may include a conveyor configured such that the main substrate on which the electronic devices are arranged moves in a linear movement scheme (e.g., along an axis extending in a particular direction) from the loader unit 12 through the solder printer unit 14, the mounter unit 16, the soldering unit 20, and the unloader unit 22. In some example embodiments, the loader unit 12 may include a conveyer device, a robotic actuator arm, or the like. In some example embodiments, the solder printer unit 14 may include a solder printing device (e.g., a solder dispenser device). In some example embodiments, the mounter unit 16 may include a conveyer device, a robotic actuator arm, or the like. In some example embodiments, the unloader unit 22 may include a conveyer device, a robotic actuator arm, or the like.

Figure 2:
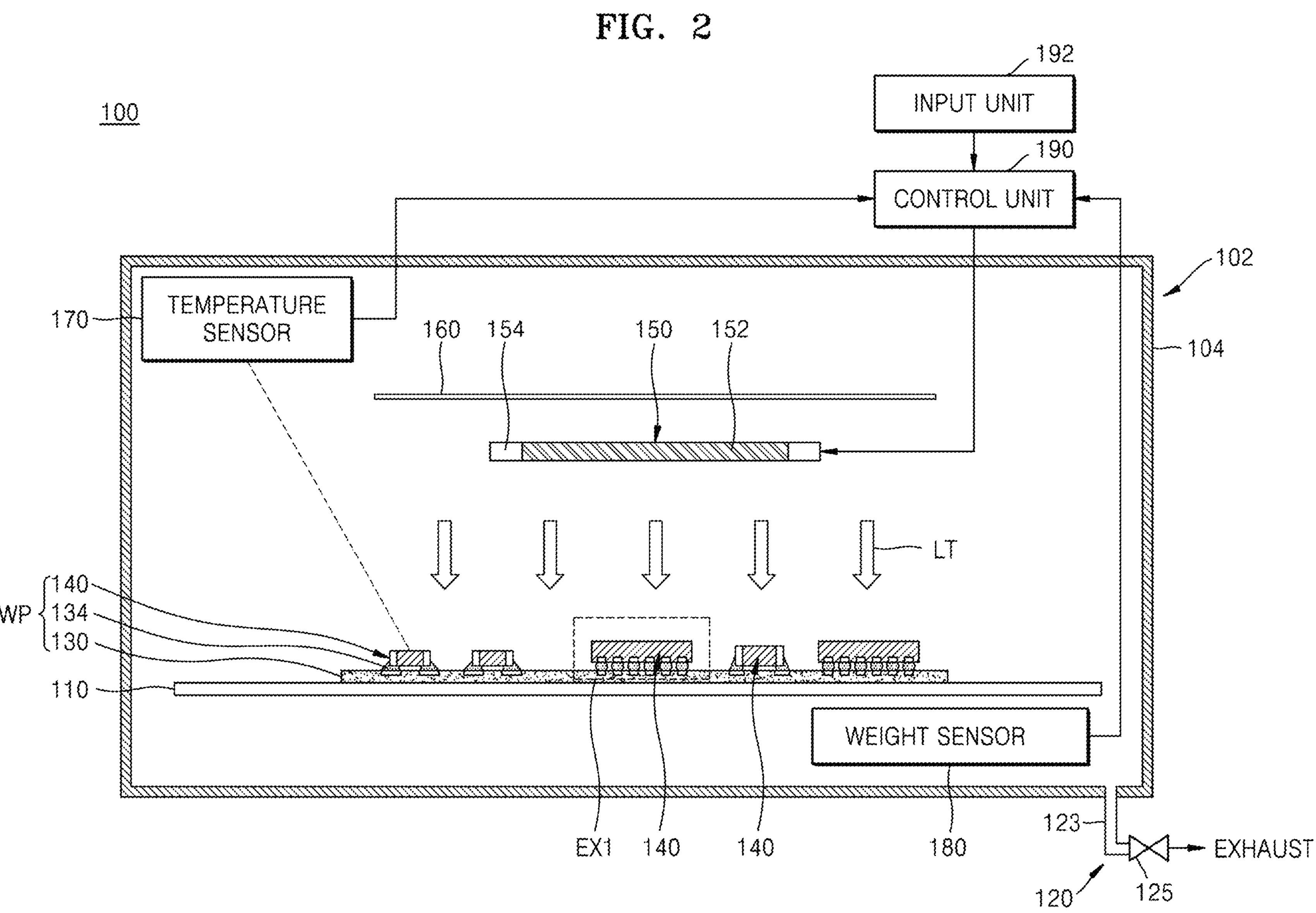
FIG. 2 is a diagram of a configuration of a soldering device according to some example embodiments.

FIG. 2 is a diagram of a configuration of a soldering device 100 according to some example embodiments. The soldering device 100 shown in FIG. 2 may be included in the soldering unit 20 of the surface mounting device 10 shown in FIG. 1.

Referring to FIG. 2, the soldering device 100 may include a soldering chamber 102, a transfer device 110 capable of moving in the soldering chamber 102 in a linear movement scheme (e.g., along an axis extending in a particular direction), a pulsed light irradiator 150, and a control unit 190.

The soldering chamber 102 may include a chamber frame 104 defining an inner space in which a workpiece WP may be contained. An entrance unit (not shown), such as a door, hatch, portal, or the like, through which the workpiece WP may enter and exit may be installed at the chamber frame 104.

The chamber frame 104 of the soldering chamber 102 may include a material capable of withstanding a temperature of about 200° C. to about 300° C. In some example embodiments, the chamber frame 104 may include a material, such as a metal, ceramic, and a polymer, without being limited thereto.

An exhaust device 120 may be connected to a partial region of the soldering chamber 102. The exhaust device 120 may include an exhaust pipe 123 and a valve 125 connected to the exhaust pipe 123. The valve 125 may discharge an unnecessary gas (e.g., fume) from the inside of the soldering chamber 102. The valve 125 may be, for example, a ball valve, a globe valve, a gate valve, or a control valve, without being limited thereto.

The transfer device 110 may include a conveyor configured to move the plurality of workpieces WP in a linear movement scheme (e.g., along an axis extending in a particular direction) in the soldering chamber 102.

The workpiece WP may include a main substrate 130, an electronic device 140 located on the main substrate 130, and a solder material layer 134 between the main substrate 130 and the electronic device 140.

Figure 3:
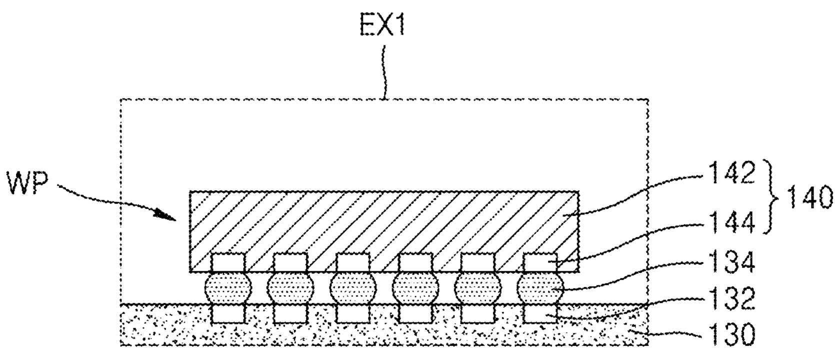
FIG. 3 is an enlarged cross-sectional view of portion EX1 of FIG. 2.

FIG. 3 is an enlarged cross-sectional view of portion EX1 of FIG. 2.

Referring to FIGS. 2 and 3, the main substrate 130 may be an arbitrary substrate including a mounting region to which the electronic device 140 is to be bonded. For example, the main substrate 130 may include a wafer including a PCB, a carrier substrate, and a redistribution layer.

The mounting region of the main substrate 130 may include a plurality of connection pads 132. The plurality of connection pads 132 may include a conductive material, for example, copper (Cu), aluminum (Al), silver (Ag), titanium (Ti), nickel (Ni), or any combination thereof, without being limited thereto. Although the plurality of connection pads 132 are illustrated as being coplanar with a surface of the main substrate 130 in FIG. 3, embodiments are not limited thereto. For example, the plurality of connection pads 132 may protrude from the surface of the main substrate 130.

A plurality of solder material layers 134 may include solder paste, solder balls, solder bumps, flux, or any combination thereof, without being limited thereto. The plurality of solder material layers 134 may respectively be in contact with the plurality of connection pads 132.

The electronic device 140 may include a main body 142 and a plurality of connection pads 144 arranged on one surface of the main body 142. The main body 142 of the electronic device 140 may be a semiconductor die itself or a package in which the semiconductor die is encapsulated by a molding member. The molding member may include, for example, a polymer material, such as an epoxy molding compound (EMC). When the main body 142 is a package, the molding member may include at least one semiconductor die. When the main body 142 includes a plurality of semiconductor dies, the plurality of semiconductor dies may include semiconductor dies of the same type or semiconductor dies of different types. In the electronic device 140, the plurality of connection pads 144 may include a conductive material, for example, copper (Cu), aluminum (Al), silver (Ag), titanium (Ti), nickel (Ni), or any combination thereof, without being limited thereto. Although the plurality of connection pads 144 are illustrated as being coplanar with a surface of the main body 142 in FIG. 3, embodiments are not limited thereto. In some example embodiments, the plurality of connection pads 144 may protrude from the surface of the main body 142. For example, the plurality of connection pads 144 may be solder bumps. In this case, the plurality of connection pads 144 may include at least one material selected from tin (Sn), gold (Au), silver (Ag), platinum (Pt), copper (Cu), bismuth (Bi), palladium (Pd), chromium (Cr), calcium (Ca), nickel (Ni), germanium (Ge), zinc (Zn), manganese (Mn), cobalt (Co), tungsten (W), antimony (Sb), lead (Pb), and any alloy thereof, without being limited thereto.

A plurality of electronic devices 140 mounted on the main substrate 130 may include semiconductor chips, semiconductor packages, or passive elements, such as multi-layer ceramic condensers (MLCCs). In some example embodiments, the electronic device 140 may include a volatile memory chip (e.g., dynamic random access memory (DRAM)) and static RAM (SRAM)), a non-volatile memory chip (e.g., phase-change RAM (PRAM), magnetoresistive RAM (MRAM), ferroelectric RAM (FeRAM), and resistive RAM (RRAM)); and a logic chip (e.g., a high bandwidth memory (HBM) DRAM semiconductor chip, a microprocessor, an analog device, and a digital signal processor. When the electronic device 140 is a semiconductor package, the electronic device 140 may be a flip-chip package, a ball grid array (BGA) package, a lead frame package, or a quad flap package (QFP). In some example embodiments, the electronic device 140 may be a System In Package (SIP) or a wafer-level package (WLP).

Referring to FIG. 2, the transfer device 110 may include a conveyor configured to move a plurality of workpieces WP in the soldering chamber 102 in a linear movement scheme (e.g., move the plurality of workpieces WP in the soldering chamber 102 along an axis extending in a particular direction).

The pulsed light irradiator 150 may irradiate IPL to a workpiece WP. The pulsed light irradiator 150 may include a light source 152 and a power supply unit 154. In some example embodiments, the light source 152 may include a xenon lamp. For example, the light source 152 may include a xenon flash lamp. A wavelength of the light source 152 may be in a range of about 185 nm to about 2000 nm or a range of about 400 nm to about 1200 nm. A frequency of light LT irradiated by the light source 152 may be about 2 Hz to about 4 Hz. A pulse width of light LT irradiated by the light source 152 may be selected in a range of about 0.1 ms to about 10 ms, for example, in a range of about 2 ms to about 4 ms, without being limited thereto. The power supply unit 154 may supply power, which is rectified into a direct current (DC) high voltage, to the light source 152. In some example embodiments, the power supply unit 154 may be an alternating current (AC) power source.

During a soldering process, light LT may be irradiated from the pulsed light irradiator 150 to the workpiece WP. During the irradiation of the light LT to the workpiece WP, light energy from the light source 152 may be converted into thermal energy, and a temperature of the solder material layer 134 may be raised to a melting point due to the thermal energy in the workpiece WP, and thus, a light soldering process may be performed. In some example embodiments, a melting point of the solder material layer 134 may be in a range of about 180° C. to about 250° C., without being limited thereto. After the solder material layer 134 is melted by using light LT from the light source 152, the solder material layer 134 may be hardened again, and thus, the light soldering process may be completed.

As shown in FIG. 2, the pulsed light irradiator 150 may be connected to the control unit 190 and operate in response to a control signal from the control unit 190.

The soldering device 100 may further include a temperature sensor 170 connected to the control unit 190. The temperature sensor 170 may be in the soldering chamber 102, measure a temperature of the electronic device 140 included in the workpiece WP, in a noncontact manner, and transmit a measurement of a temperature of the electronic device 140 to the control unit 190.

The soldering device 100 may further include a weight sensor 180 connected to the control unit 190. The weight sensor 180 may be in the soldering chamber 102, measure a weight of the electronic device 140 included in the workpiece WP, and transmit a measurement of the weight of the electronic device 140 to the control unit 190. In some example embodiments, the weight sensor 180 may include a transducer configured to convert an input mechanical load caused by at least the electronic device 140 into an electrical output signal and may transmit the electrical output signal to the control unit 190 as the measurement of the weight of the electronic device 140.

The control unit 190 may be configured to control the soldering device 100 to implement any of the functionality of the soldering device 100 according to any of the example embodiments, including causing the soldering device 100 and/or portions thereof to perform one or more, some, or all operations of any of the methods according to any of the example embodiments, including any of the soldering methods according to any of the example embodiments. The control unit 190 may include, may be included in, and/or may be implemented by one or more instances of processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD) device, storing a program of instructions, and a processor (e.g., a CPU) configured to execute the program of instructions to implement the functionality and/or methods performed by some or all of any devices, systems, modules, units, controllers, and/or portions thereof according to any of the example embodiments, and/or any portions thereof. For example, the control unit 190 may include a memory (e.g., an SSD) storing a program of instructions and may further include a processor (e.g., a CPU) configured to execute the program of instructions to implement any of the functionality of the soldering device 100 according to any of the example embodiments, including causing the soldering device 100 and/or portions thereof to perform one or more, some, or all operations of any of the methods according to any of the example embodiments, including any of the soldering methods according to any of the example embodiments.

In some example embodiments, the temperature sensor 170 in the soldering chamber 102 may include an infrared (IR) temperature sensor or a thermal imaging camera, without being limited thereto. When the temperature sensor 170 includes an IR temperature sensor, the temperature sensor 170 may measure a temperature of at least one point of one selected electronic device 140 and provide a temperature and/or temperature distribution of the selected electronic device 140 to the control unit 190. When the temperature sensor 170 includes a thermal imaging camera, IR light emitted from the selected electronic device 140 may reach the thermal imaging camera during a soldering process using the soldering device 100. Thus, the temperature sensor 170 may measure the temperature and/or the temperature distribution of the selected electronic device 140 in real time, and provide the temperature and/or the temperature distribution of the selected electronic device 140 to the control unit 190. During the soldering process using the soldering device 100, the temperature sensor 170 may measure a temperature variation of the electronic device 140 in real time and transmit a measurement result to the control unit 190.

The control unit 190 may set (e.g., select) power (e.g., intensity) of a light pulse generated by the pulsed light irradiator 150, the number (e.g., quantity) of exposures of the light pulse, and an irradiation period of the light pulse, based on the measurement of the temperature from the temperature sensor 170, predict a final rise temperature of the electronic device 140 (also referred to herein interchangeably as calculating a predicted value of the final rise temperature of the electronic device 140, calculating a predicted final rise temperature of the electronic device 140, or the like), based on the set (e.g., selected) values, the measurement of the temperature from the temperature sensor 170, and the weight of the electronic device 140, and change (e.g., control the pulsed light irradiator 150 to change) at least one of power of the light pulse irradiated (e.g., emitted) from the pulsed light irradiator 150, a time width of the light pulse, or the irradiation period of the light pulse, based on the predicted result of the final rise temperature (also referred to herein interchangeably as the predicted value of the final rise temperature, the calculated predicted final rise temperature, or the like). Accordingly, during the soldering process, the control unit 190 may control the temperature of the electronic device 140 in real-time (e.g., based on controlling the pulsed light irradiator 150), based on a real-time measurement of the temperature from the temperature sensor 170, and effectively control the soldering process conditions such that a final temperature of the electronic device 140, which is measured when the soldering process is completed, is within an allowable range (also referred to herein interchangeably as a particular temperature range).

An input unit 192 may be connected (e.g., communicatively coupled) to the control unit 190. Pieces of information required for the soldering process may be input by the input unit 192 to the control unit 190. In some example embodiments, the input unit 192 may include a user interface (e.g., a keyboard, one or more buttons, a touchscreen display interface, a computing device (e.g., a device including a memory storing a program of instructions and a processor configured to execute the program of instructions to provide the pieces of information to the control unit 190), any combination thereof, or the like. In some example embodiments, the input unit 192 may include a communication transceiver (e.g., a wireless and/or wired network communication transceiver) configured to receive the pieces of information from a remote source which may include one or more computing devices, user interfaces, or the like.

Figure 4:
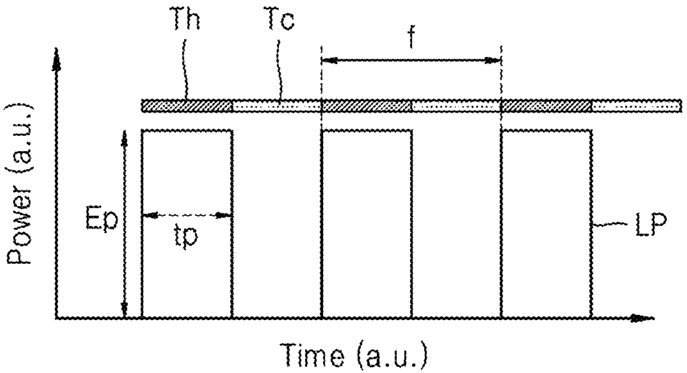
FIG. 4 is a graph showing power, a time width, and an irradiation period of each of light pulses generated by a pulsed light irradiator of a soldering device according to some example embodiments.
Figure 5:
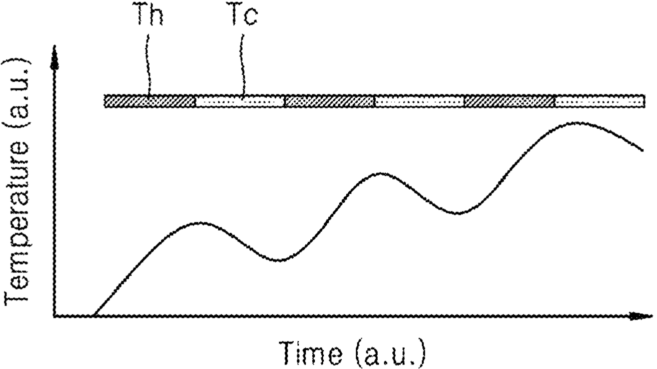
FIG. 5 is a graph showing a temperature variation of a workpiece due to the light pulses shown in FIG. 4.

FIG. 4 is a graph showing power Ep, a time width tp, and an irradiation period f of each of light pulses LP generated by the pulsed light irradiator 150 of the soldering device 100 shown in FIG. 2. FIG. 5 is a graph showing a temperature variation of the workpiece WP due to the light pulses LP shown in FIG. 4.

Referring to FIGS. 4 and 5, the light pulses LP generated by the pulsed light irradiator 150 may emit light having a relatively high intensity (e.g., power) in a very short heating period Th of, for example, about 0.1 ms to about 20 ms, and the light may be converted into heat (e.g., based on the light pulses LP applying power to the workpiece WP) to heat the workpiece WP. In a cooling period Tc between the respective light pulses LP, heat generated due to the light pulses LP may be dispersed to reduce a temperature of the workpiece WP.

Typically, the light pulses LP generated by the pulsed light irradiator 150 may be converted into heat and transmitted to the workpiece WP. In this case, when the light pulses LP are repeatedly applied to the workpiece WP before the heat transmitted to the workpiece WP is dispersed, heat may concentrate on a surface of the workpiece WP to cause a burning phenomenon. In particular, when a soldering process is performed on a product having a relatively high thermal capacity, such as a bulk-scale product (e.g., a solid-state device (SSD) and a module), it may be necessary to efficiently control pulse energy of the light pulses LP generated by the pulsed light irradiator 150.

In the soldering device 100 according to some example embodiments, the control unit 190 may predict a final rise temperature (e.g., calculate a predicted final rise temperature) of the electronic device 140, based on a power of the light pulse LP generated by the pulsed light irradiator 150, a weight of the electronic device 140, a real-time temperature of the electronic device 140, the number (e.g., quantity) of exposures of the light pulse LP, and an irradiation period of the light pulse LP, and the control unit 190 may change at least one of the power of the light pulse LP, a time width of the time pulse LP, or the irradiation period of the light pulse, based on the predicted results of the final rise temperature.

In some example embodiments, the control unit 190 may calculate power Ep of the light pulse generated by the pulsed light irradiator 150 according to Equation 1:

$$E_P = \frac{V^3 t_P}{K_0^2} \quad \text{[Equation 1]}$$

Wherein, in Equation 1, V denotes a charging voltage of the pulsed light irradiator 150, tp denotes a time width of a light pulse generated by the pulsed light irradiator 150, and $K_0$ denotes an impedance of the pulsed light irradiator 150.

The charging voltage V of the pulsed light irradiator 150 may be selected (e.g., by the control unit 190) in a range of about 500 V to about 2000 V. The impedance $K_0$ of the pulsed light irradiator 150 may vary according to an inner diameter of quartz included in the pulsed light irradiator 150, an arc length, a type of gas (e.g., Xe gas), a pressure of gas, and a change in voltage. A value of the charging voltage V of the pulsed light irradiator 150, a value of the time width tp of the light pulse generated by the pulsed light irradiator 150, and/or a value of the impedance $K_0$ of the pulsed light irradiator 150 may be stored at the control unit 190 (e.g., in a memory thereof) and accessed by the control unit 190 to calculate the power Ep of the light pulse generated by the pulsed light irradiator 150 according to Equation 1. Equation 1 may be applied to calculate power Ep of a light pulse that is yet to be generated by the pulsed light irradiator 150 based on stored, determined, adjusted, etc., values of the charging voltage V, time width tp, and/or impedance $K_0$. The control unit 190 may be configured to control the soldering device 100 (e.g., the pulsed light irradiator 150) to change one or more of the charging voltage V, time width tp, and/or impedance $K_0$ and may calculate a power Ep (which may be a changed power Ep) of future light pulses generated by the pulsed light irradiator 150 based on the present (e.g., changed) charging voltage V, time width tp, and impedance $K_0$.

The control unit 190 may predict a final rise temperature ΔT of the electronic device 140 (e.g., calculate a predicted final rise temperature ΔT of the electronic device 140) according to Equation 2:

$$\Delta T = \sum_{n=1}^{N} \frac{E_P}{cM} - (aT + b)(1/f) \quad \text{[Equation 2]}$$

Wherein, in Equation 2, c denotes specific heat of the electronic device 140, M denotes a weight of the electronic device 140, T denotes the temperature of the electronic device 140, which is measured in real time in the soldering chamber 102 immediately (e.g., about 0.01 ms to about 1 ms) before subsequent irradiation of pulsed light generated by the pulsed light irradiator 150 (e.g., immediately prior to the calculating the predicted final rise temperature ΔT of the electronic device 140 according to Equation 2), f denotes an irradiation period of the light pulse generated by the pulsed light irradiator 150, each of a and b denotes a particular (or, alternatively, predetermined) constant that determines a temperature attenuation function represented by "aT+b", and N denotes the number of exposures of light pulses to the electronic device 140. A value of the specific heat c of the electronic device 140, a value of the weight M of the electronic device 140, a value of an irradiation period f of the light pulse generated by the pulsed light irradiator 150, a value of constant a, a value of constant b, and/or a value of N may be stored at the control unit 190 (e.g., in a memory thereof) and accessed by the control unit 190 to calculate the predicted final rise temperature ΔT of the electronic device 140 according to Equation 2. Equation 2 may be applied to calculate a predicted final rise temperature ΔT based on power Ep of light pulses that are yet to be generated by the pulsed light irradiator 150 and exposed to the electronic device 140 a number N (also referred to herein interchangeably as a quantity) of times based on stored, determined, adjusted, etc., values of the specific heat c of the electronic device 140, the weight M of the electronic device 140, the irradiation period f of the light pulse(s), constant a, constant b, and/or number N. The control unit 190 may be configured to control the soldering device 100 (e.g., the pulsed light irradiator 150) to change one or more of the power Ep of one or more future light pulses, the time width tp of one or more future light pulses, and/or the irradiation period f of one or more future light pulses generated by the pulsed light irradiator 150 based on the present (e.g., changed) charging voltage V, time width tp, impedance $K_0$, power Ep, specific heat c, weight M, irradiation period f, constant a, constant b, and/or number N.

As shown in FIG. 2, the soldering device 100 may further include a reflector 160, which is in the soldering chamber 102 and apart (e.g., spaced apart) from the transfer device 110 with the pulsed light irradiator 150 therebetween. The reflector 160 may reflect pulsed light from the pulsed light irradiator 150 toward the workpiece WP. The reflector 160 may include a reflective material, for example at least one material selected from tin (Sn), gold (Au), silver (Ag), platinum (Pt), copper (Cu), bismuth (Bi), palladium (Pd), chromium (Cr), calcium (Ca), nickel (Ni), germanium (Ge), zinc (Zn), manganese (Mn), cobalt (Co), tungsten (W), antimony (Sb), lead (Pb), and any alloy thereof.

In the soldering device 100, a light filter unit (e.g., a filter mask configured to selectively absorb energy in a specific wavelength band) may not be between the pulsed light irradiator 150 and the workpiece WP. Accordingly, the loss of light source energy due to the light filter unit may be reduced, minimized, or prevented from occurring between the pulsed light irradiator 150 and the workpiece WP, and a soldering process may be performed economically and efficiently based on uniformly transmitting light pulse energy from the pulsed light irradiator 150 to the workpiece WP, where the at least one of the power of the light pulse, a time width of the light pulse, or the irradiation period of the light pulse, based on a predicted result of a final rise temperature $\Delta T$ of the electronic device 140, such that the light pulse is controlled to reduce, minimize, or prevent excessive heating of the workpiece without a light filter unit being between the pulsed light irradiator 150 and the workpiece WP.

Figure 6A:
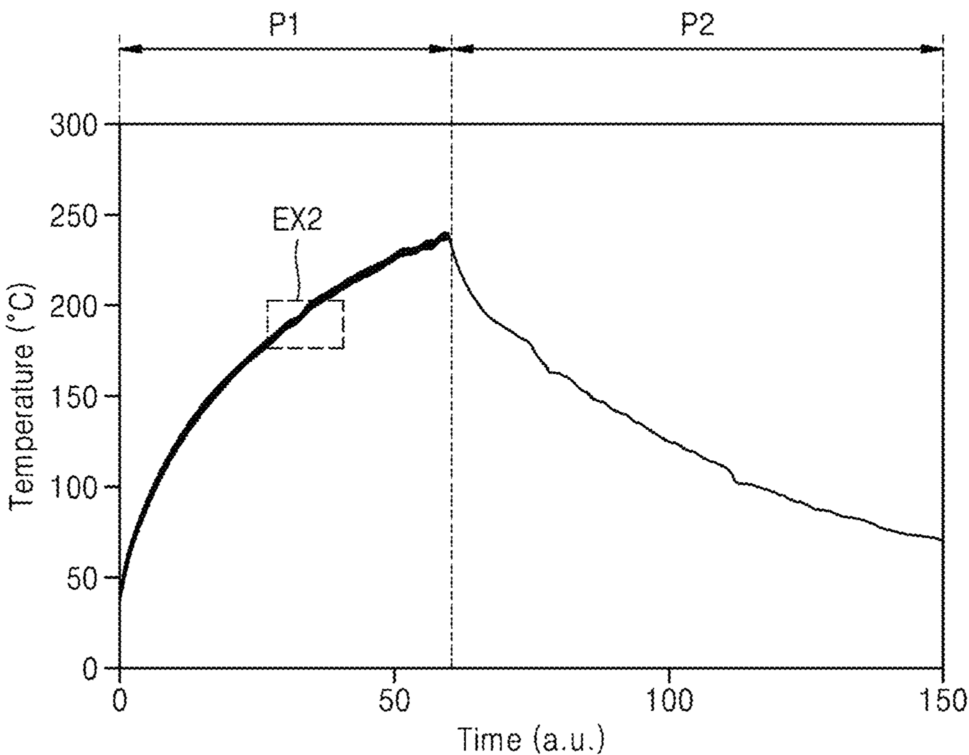
FIG. 6A is a graph showing a temperature variation of an electronic device in a time period during which a soldering process is performed on a soldering device according to some example embodiments and in a time period after the soldering process is completed.
Figure 6B:
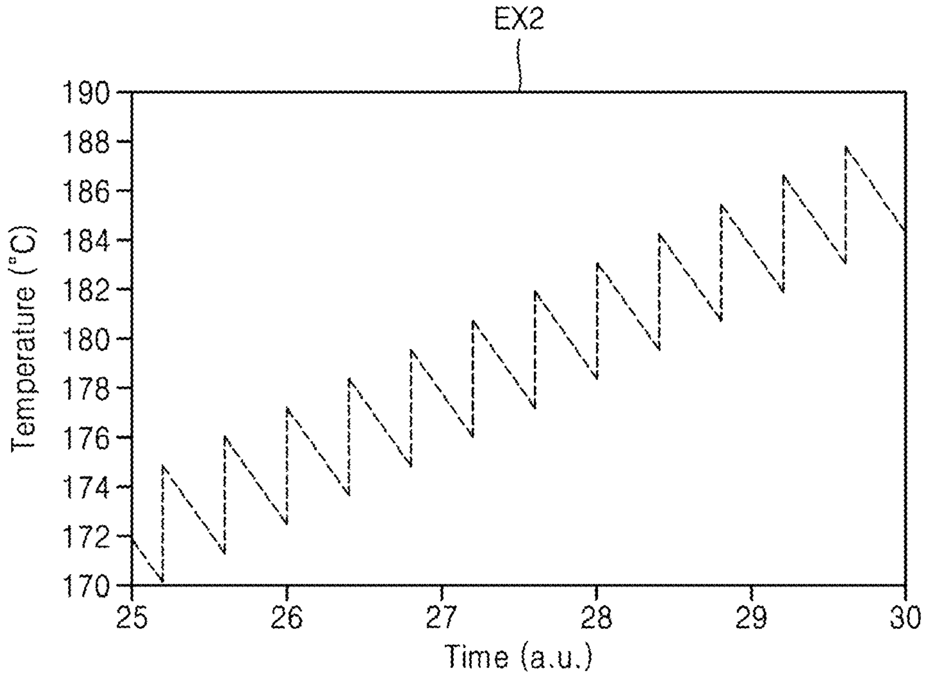
FIG. 6B is an enlarged graph of portion EX2 of FIG. 6A.

When the final rise temperature $\Delta T$ of the electronic device 140 is predicted according to Equations 1 and 2 described above in the control unit 190 of the soldering device 100 and a soldering process is performed by heating the workpiece WP while changing at least one of the power of the light pulse, the time width tp of the light pulse, or the irradiation period f of the light pulse, based on the predicted result of the final rise temperature $\Delta T$, FIG. 6A is a graph showing a temperature variation of the electronic device 140 in a time period P1 during which the soldering process is performed and in a time period P2 after the soldering process is completed. FIG. 6B is an enlarged graph of portion EX2 of FIG. 6A.

Referring to FIGS. 6A and 6B, in the time period P1 in which the soldering process is performed, a rise in temperature of the electronic device 140 may be determined according to the number (e.g., quantity) N of exposures of light pulses to the electronic device 140. In the time period P1 in which the soldering process is performed, a temperature of the electronic device 140 may increase relatively rapidly during a time period for which the electronic device 140 is exposed to light pulses from the pulsed light irradiator 150, and may decrease during a time period for which the electronic device 140 is not exposed to the light pulses from the pulsed light irradiator 150. That is, during the time period P1 in which the soldering process is performed, the temperature of the electronic device 140 may repeatedly rise and fall. In the time period P1 in which the soldering process is performed, a temperature variation of the electronic device 140 may be predicted by Equations 1 and 2 described above.

Figure 7:
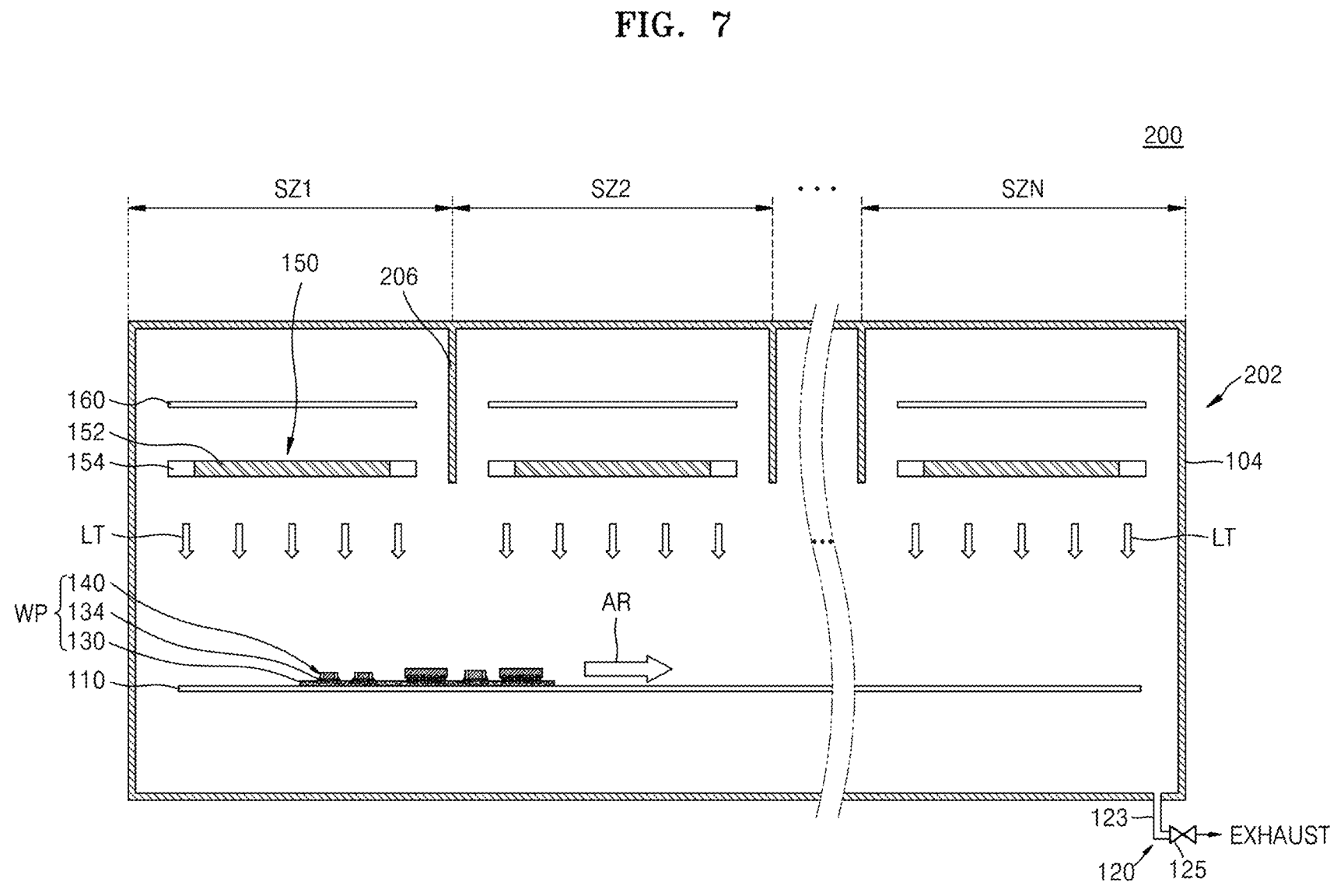

FIG. 7 is a diagram of a configuration of a soldering device 200 according to some example embodiments. The soldering device 200 shown in FIG. 2 may be included in the soldering unit 20 of the surface mounting device 10 shown in FIG. 1. In FIG. 7, the same reference numerals are used to denote the same elements as in FIG. 2, and thus, detailed descriptions thereof are omitted.

Referring to FIG. 7, the soldering device 200 may substantially have the same configuration as the soldering device 100 described with reference to FIG. 2. However, the soldering device 200 may include a soldering chamber 202 including a plurality of soldering zones SZ1, SZ2, . . . , and SZN ("N" being any positive integer), which are arranged in a line in a direction (e.g., an arrow direction AR, also referred to herein as a particular direction)) in which a transfer device 110 moves. A plurality of pulsed light irradiators 150 and a plurality of reflectors 160 may be in the soldering chamber 202, and one pulsed light irradiator 150 and one reflector 160 may be in each of the plurality of soldering zones SZ1, SZ2, . . . , and SZN. In the soldering chamber 202, the plurality of pulsed light irradiators 150 may be apart (e.g., spaced apart) from each other and arranged in a line in the direction (e.g., the arrow direction AR) in which the transfer device 110 moves. Also, the plurality of reflectors 160 may be apart (e.g., spaced apart) from each other and arranged in a line in the direction (e.g., the arrow direction AR) in which the transfer device 110 moves.

A plurality of partition walls 206 may be in the soldering chamber 202. Each of the plurality of partition walls 206 may be between two adjacent ones of the plurality of pulsed light irradiators 150. The plurality of soldering zones SZ1, SZ2, . . . , and SZN may be separated (e.g., isolated) from each other by the plurality of partition walls 206. In some example embodiments, the partition wall 206 may include the same material as a constituent material of the chamber frame 104, without being limited thereto.

Details of the soldering device 200 shown in FIG. 7 may substantially be the same as those of the soldering device 100 described with reference to FIG. 2. That is, although not shown, the temperature sensor 170 and the weight sensor 180, which are shown in FIG. 2 may be in the soldering chamber 202 of the soldering device 200 shown in FIG. 7. Also, the soldering device 200 may include a control unit 190 and an input unit 192, which have been described with reference to FIG. 2.

In the soldering chamber 202 of the soldering device 200 shown in FIG. 7, the electronic device 140 included in the workpiece WP may be exposed to light pulses from the pulsed light irradiator 150 while sequentially passing through the plurality of soldering zones SZ1, SZ2, . . . , and SZN in the direction (e.g., the arrow direction AR) in which the transfer device 110 moves. A rise in temperature of the electronic device 140 may be determined according to (e.g., may be calculated according to, may be based on, etc.) the number (e.g., quantity) N of exposures of light pulses to the electronic device 140 while the electronic device 140 is sequentially passing through the plurality of soldering zones SZ1, SZ2, . . . , and SZN in the direction in which the transfer device 110 moves. While the electronic device 140 is sequentially passing through the plurality of soldering zones SZ1, SZ2, . . . , and SZN in the direction (e.g., the arrow direction AR) in which the transfer device 110 moves, a temperature variation of the electronic device 140 may be predicted by Equations 1 and 2 described above.

Figure 8:
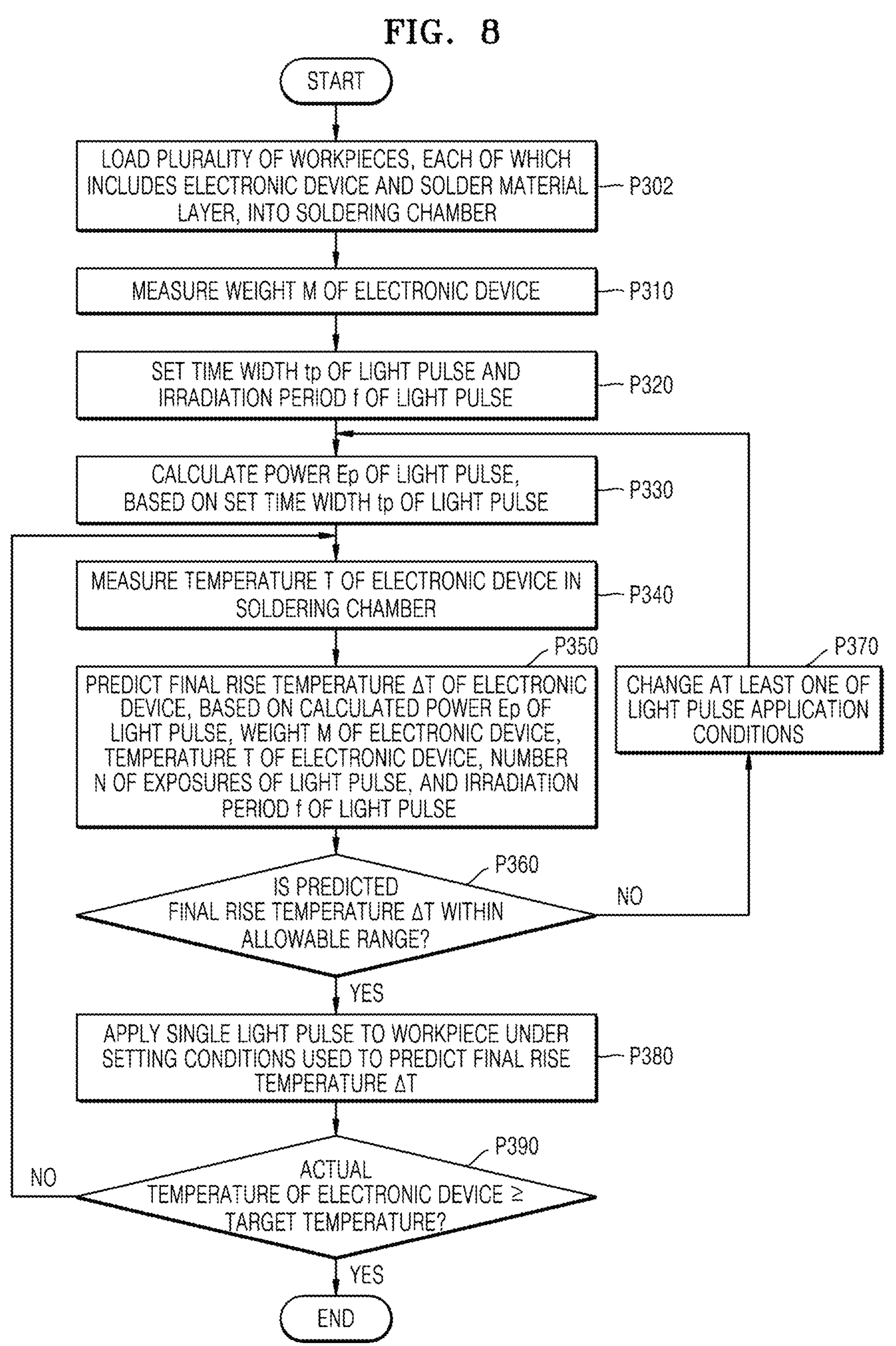
FIG. 8 is a flowchart of a soldering method according to some example embodiments.

FIG. 8 is a flowchart of a soldering method according to some example embodiments. In some example embodiments, including the example embodiments shown in FIG. 8, an example of performing a soldering process (also referred to herein interchangeably as a soldering method) by using the soldering device 100 shown in FIG. 2 (e.g., based on operation of the control unit 190 to control the soldering device 100 and/or portions thereof, for example based on a processor of the control unit 190 executing a program of instructions stored at a memory of the control unit 190) is described. However, the example embodiments are not limited thereto. For example, the soldering method shown in FIG. 8 may be performed by using the soldering device 100 shown in FIG. 2, the soldering device 200 shown in FIG. 7, or a soldering device that is variously modified and changed within the scope of the inventive concepts.

Referring to FIGS. 2 and 8, in process P302, a workpiece WP including a main substrate 130, an electronic device 140 located on the main substrate 130, and a solder material layer 134 between the main substrate 130 and the electronic device 140 may be loaded into a soldering chamber 102 including a pulsed light irradiator 150 by using a transfer device 110.

In process P310 of FIG. 8, a weight M of the electronic device 140 may be measured.

In some example embodiments, the weight M of the electronic device 140 may be measured by using the weight sensor 180 in the soldering chamber 102. In some example embodiments, the weight M of the electronic device 140 may be a value that is previously measured by using another weight measuring unit outside the soldering chamber 102 and may be stored at the control unit 190 (e.g., at a memory thereof).

In process P320 of FIG. 8, a time width tp of a light pulse irradiated by the pulsed light irradiator 150 (e.g., a future light pulse yet to be irradiated by the pulsed light irradiator 150) and an irradiation period f of the light pulse may be set (e.g., may be selected, determined, etc.).

In some example embodiments, the time width tp of the light pulse may be selected in a range of about 0.1 ms to about 10 ms, for example, a range of about 2 ms to about 4 ms, without being limited thereto. In some example embodiments, the irradiation period f of the light pulse irradiated by the pulsed light irradiator 150 may be variously determined as needed considering the time width tp of the light pulse and the number (e.g., quantity) N of exposures of the light pulse. The selected values of the time width tp, the irradiation period f, and the number N may be stored at the control unit 190 (e.g., at a memory thereof).

In process P330 of FIG. 8, power Ep of the light pulse (e.g., the future light pulse) from the pulsed light irradiator 150 may be calculated based on the time width tp of the light pulse, which is set (e.g., selected) in process P320.

In some example embodiments, Equation 1 provided above may be used to calculate the power Ep of the light pulse (e.g., the future light pulse), based for example on values stored at the control unit 190, including for example the charging voltage V, the time width tp, and the impedance $K_0$. The calculated value of the power Ep may be stored at the control unit 190 (e.g., at a memory thereof).

In process P340 of FIG. 8, a temperature T of the electronic device 140 may be measured in the soldering chamber 102. The measured value of the temperature T may be stored at the control unit 190 (e.g., at a memory thereof).

In some example embodiments, the temperature T of the electronic device 140 may be measured in a non-contact manner by using the temperature sensor 170 located in the soldering chamber 102.

In process P350 of FIG. 8, a final rise temperature ΔT of the electronic device 140 may be predicted, based on the power Ep of the light pulse, which is calculated in process P330, the weight M of the electronic device 140, the temperature T of the electronic device 140, which is measured in process P340, and the number N of exposures of the light pulse to the electronic device 140, and the irradiation period f of the light pulse, and further based on the specific heat c of the electronic device 140 and constant values a and b, each of which may be stored at the control unit 190 (e.g., at a memory thereof).

In some example embodiments, Equation 2 described above may be used to predict the final rise temperature ΔT of the electronic device 140. The calculated value of the predicted final rise temperature ΔT of the electronic device 140 may be stored at the control unit 190 (e.g., at a memory thereof).

In process P360 of FIG. 8, in process P350, it may be determined whether the predicted final rise temperature ΔT of the electronic device 140 deviates from an allowable range (also referred to herein as a particular temperature range). The allowable range (e.g., the range of temperature values thereof) may be stored at the control unit 190 (e.g., at a memory thereof) and accessed as part of the determination at process P350.

When it is determined (e.g., in response to a determination) in process P360 that the predicted final rise temperature ΔT of the electronic device 140 deviates from the allowable range (e.g., is a value that is outside, or not included within, the range of values of the particular temperature range), in process P370, at least one of light pulse application conditions, for example, at least one of the power Ep of the light pulse from the pulsed light irradiator 150, the time width tp of the light pulse, or the irradiation period f of the light pulse may be changed (e.g., changed by the control unit 190). The changed value of the changed at least one of the power Ep of the light pulse from the pulsed light irradiator 150, the time width tp of the light pulse, or the irradiation period f of the light pulse (e.g., changed condition) may be stored at the control unit 190 (e.g., at a memory thereof). Thereafter, process P330, process P340, process P350, and process P360 of FIG. 8 may be sequentially and repeatedly performed based on the changed condition (e.g., the changed value).

When it is determined (e.g., in response to a determination) in process P360 that the predicted final rise temperature ΔT of the electronic device 140 is within the allowable range (e.g., is a value that is inside, or is included within, the range of values of the particular temperature range), in process P380, a single light pulse may be applied to the workpiece WP by using the pulsed light irradiator 150 under setting conditions used to predict the final rise temperature ΔT of the electronic device 140 (e.g., using the time width tp, power Ep, irradiation period f, or the like used to calculate the predicted final rise temperature ΔT at P350 and for which P360=YES). In some example embodiments, the pulsed light irradiator 150 may irradiate (e.g., generate, emit, etc.) intense pulsed light (IPL). For example, the pulsed light irradiator 150 may include a xenon flash lamp. A wavelength of the xenon flash lamp may be in a range of about 185 nm to about 2000 nm or a range of about 400 nm to about 1200 nm.

In process P390 of FIG. 8, an actual temperature of the electronic device 140 may be calculated or measured, and it may be determined whether the actual temperature of the electronic device 140 is higher than or equal to a target temperature.

In some example embodiments, an actual temperature Tr of the electronic device 140 may be calculated based on the sum (i.e., Tr=T0+ΔT) of a temperature $T_0$ obtained immediately (e.g., about 0.01 ms to about 1 ms) after the electronic device 140 is put into the soldering device 100 and the final rise temperature ΔT predicted in process P350. In some example embodiments, the actual temperature of the electronic device 140 may be measured by using the temperature sensor 170 located in the soldering chamber 102. In some example embodiments, the target temperature may be set in a range of about 180° C. to about 250° C., for example, about 200° C. to about 250° C., without being limited thereto. The target temperature may be variously determined considering the weight M and thermal capacity of the electronic device 140.

In process P390, when it is determined (e.g., in response to a determination) that the actual temperature of the electronic device 140 is higher than or equal to a target temperature (which may be a target temperature value that is stored at the control unit 190, for example at a memory thereof), the soldering process performed on the workpiece WP may end. When it is determined (e.g., in response to a determination) in process P390 that the actual temperature of the electronic device 140 is lower than the target temperature, process P340, process P350, process P360, process P370, and process P380 of FIG. 8 may be repeatedly performed.

In some example embodiments, during the process of soldering the workpiece WP according to processes P302 to P390 of FIG. 8, a plurality (e.g., number N) of light pulses (e.g., about 10 to 300 light pulses or about 10 to 30 light pulses) may be applied to the electronic device 140. Before each of the plurality of light pulses is applied to the electronic device 140, the actual temperature of the electronic device 140 may be re-measured by using the temperature sensor 170 located in the soldering chamber 102, according to process P340 of FIG. 8, and the final rise temperature ΔT of the electronic device 140 may be re-predicted according to process P350, based on the re-measured actual temperature of the electronic device 140. In the process of re-predicting the final rise temperature ΔT of the electronic device 140 according to process P350, the final rise temperature ΔT of the electronic device 140 may be re-predicted, based on the power Ep of the light pulse, which is recalculated according to process P330, the weight M of the electronic device 140, the temperature T of the electronic device 140, which is re-measured according to process P340, the number N of exposures of the light pulse to the electronic device 140, and the irradiation period f of the light pulse.

In some example embodiments, a K-th light pulse (K is a natural number of 1 or more) and a K+1-th light pulse may be applied to the electronic device 140 under a condition where at least one selected from the power Ep of the light pulse and the time width tp of the light pulse has the same value, for example such that at least one selected from a power of the K+1-th light pulse and a time width of the K+1-th light pulse has a same value as a corresponding at least one of a power of the K-th light pulse and a time width of the K-th light pulse. In some example embodiments, the K-th light pulse and the K+1-th light pulse may applied to the electronic device 140 under conditions where at least one selected from the power Ep of the light pulse and the time width tp of the light pulse has different values.

During the soldering process by using the soldering method described with reference to FIG. 8, a temperature of the electronic device 140 may uniformly rise within a temperature deviation of about ±10° C. Accordingly, the solder material layer 134 between the main substrate 130 and the electronic device 140 may be melted at an appropriate temperature, and thus, a stable electrical connection may be formed between the main substrate 130 and the electronic device 140, thereby reducing or minimizing the risk of excessive heating of the electronic device and thus reducing or minimizing the risk of defects in the electronic device 140 due to overheating during the soldering process. In the soldering method described with reference to FIG. 8, because the soldering process is performed by using the pulsed light irradiator 150 configured to irradiate IPL, a melting rate of the solder material layer 134 may be higher than in a common reflow soldering process. Also, after the soldering process is completed, a cooling rate of the electronic device 140 may be higher than in the reflow soldering process. Accordingly, after the soldering process performed according to the soldering method described with reference to FIG. 8 is completed, a connection layer obtained from the solder material layer 134 may have a smaller thickness than a connection layer obtained using the common reflow soldering process, and thus the electronic device 140 and/or workpiece WP may have improved mechanical strength and thus improved reliability due to reduced risk of mechanical failure.

For example, when the solder material layer 134 used in process P302 of FIG. 8 includes solder paste including tin (Sn) and silver (Ag), after the electronic device 140 is bonded onto the main substrate 130 by performing the soldering process according to the soldering method shown in FIG. 8, a connection layer including an intermetallic compound (IMC) including copper (Cu) and tin (Sn) may be formed between the main substrate 130 and the electronic device 140. The connection layer may have a thickness of about 1 μm or less (e.g., about 0.01 to about 1 μm, about 0.1 to about 1 μm, about 0.2 to about 1 μm, about 0.5 to about 1 μm, or the like). In some example embodiments, the connection layer may include a $Cu_6Sn_5$ alloy, a $Cu_3Sn$ alloy, or any combination thereof, without being limited thereto.

The connection layer, which remains between the main substrate 130 and the electronic device 140 after the soldering process is performed, may function as a boundary unit that may prevent separation between an internal electrode of the electronic device 140 and an external electrode of the electronic device 140. In general, after the electronic device 140 is bonded onto the main substrate 130 by completing the soldering process, as the thickness of the connection layer remaining between the main substrate 130 and the electronic device 140 increases, the connection layer may be more vulnerable to brittleness. When the connection layer has an excessively great thickness, some areas of the connection layer may be brittle, and thus, the connection layer may be broken.

After the soldering process is performed by using the soldering method according to some example embodiments, the connection layer, which remains between the main substrate 130 and the electronic device 140, may have a smaller thickness than the connection layer obtained by using the common reflow soldering process. Accordingly, the mechanical strength of a bonding structure including the connection layer located between the main substrate 130 and the electronic device 140 may be improved, thereby causing the electronic device 140 and/or the workpiece WP to have improved strength and thus improved resilience and thus improved reliability and performance due to improved resistance to mechanical failure. In addition, according to the soldering method described with reference to FIG. 8, soldering conditions for electronic devices mounted on a main substrate (e.g., a PCB) may be improved or optimized, and the productivity of the electronic devices (e.g., the production efficiency and throughput of a process to apply soldering to and/or to manufacture the electronic devices) may be improved.

Figure 9:
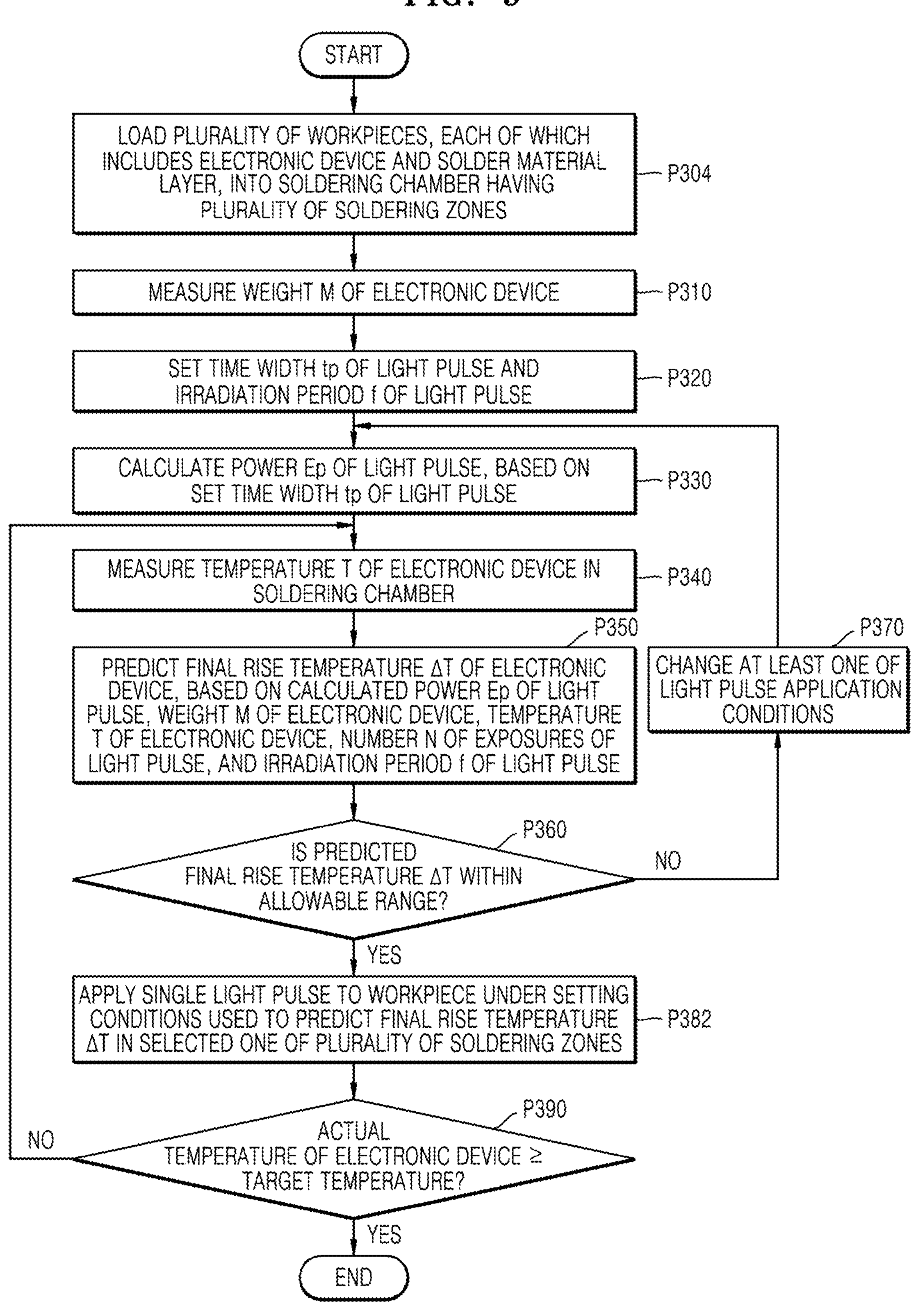
FIG. 9 is a flowchart of a soldering method according to some example embodiments.

FIG. 9 is a flowchart of a soldering method according to some example embodiments. In some example embodiments, including the example embodiments shown in FIG. 9, an example of performing a soldering process by using the soldering device 200 shown in FIG. 7 is described (e.g., based on operation of a control unit 190 to control the soldering device 200 and/or portions thereof, for example based on a processor of the control unit 190 executing a program of instructions stored at a memory of the control unit 190).

Referring to FIGS. 7 and 9, in process P304, a plurality of workpieces WP may be loaded by the transfer device 110 into the soldering chamber 202 including a plurality of soldering zones SZ1, SZ2, . . . , and SZN and a pulsed light irradiator 150, which is located in each of the plurality of soldering zones SZ1, SZ2, . . . , and SZN.

Thereafter, process P310, process P320, process P330, process P340, process P350, and process P360, which have been described with reference to FIG. 8, may be performed.

When it is determined (e.g., in response to a determination) in process P360 that the predicted final rise temperature ΔT of the electronic device 140 deviates from (e.g., is outside) an allowable range (e.g., the particular temperature range), process P370 described with reference to FIG. 8 may be performed. When it is determined (e.g., in response to a determination) in process P360 that the predicted final rise temperature ΔT of the electronic device 140 in each of the plurality of workpieces WP is within the allowable range, in process P382, a single light pulse may be applied by using the pulsed light irradiator 150 to the plurality of workpieces WP under setting conditions used to predict the final rise temperature ΔT of the electronic device 140 (e.g., using the time width tp, power Ep, irradiation period f, or the like used to calculate the predicted final rise temperature ΔT at P350 and for which P360=YES) in a selected one of the plurality of soldering zones SZ1, SZ2, . . . , and SZN. Details of the process of applying the light pulse to the plurality of workpieces WP may be the same as process P380 described with reference to FIG. 8.

In process P390, the processes described with reference to FIG. 8 may be performed.

In some example embodiments, during the process of soldering the plurality of workpieces WP according to processes P304 to P390 of FIG. 9, a plurality of light pulses (e.g., about 10 to 300 light pulses or about 10 to 30 light pulses) may be applied to the electronic device 140 included in each of the plurality of workpieces WP. Before each of the plurality of light pulses is applied to the electronic device 140, the actual temperature of the electronic device 140 may be re-measured by using the pulsed light irradiator 150 in a selected one of the plurality of soldering zones SZ1, SZ2, . . . , and SZN according to process P340 of FIG. 9, and the final rise temperature ΔT of the electronic device 140 may be re-predicted according to process P350 of FIG. 9, based on the re-measured actual temperature of the electronic device 140. In the process of re-predicting the final rise temperature ΔT of the electronic device 140 according to process P350 of FIG. 9, the final rise temperature ΔT of the electronic device 140 may be re-predicted, based on the power Ep of the light pulse, which is recalculated according to process P330, the weight M of the electronic device 140, the temperature T of the electronic device 140, which is re-measured according to process P340, the number N of exposures of the light pulse to the electronic device 140, and the irradiation period f of the light pulse.

Detailed operations and effects of the soldering method described with reference to FIG. 9 may be the same as those of the soldering method described with reference to FIG. 8.

Figure 10A:
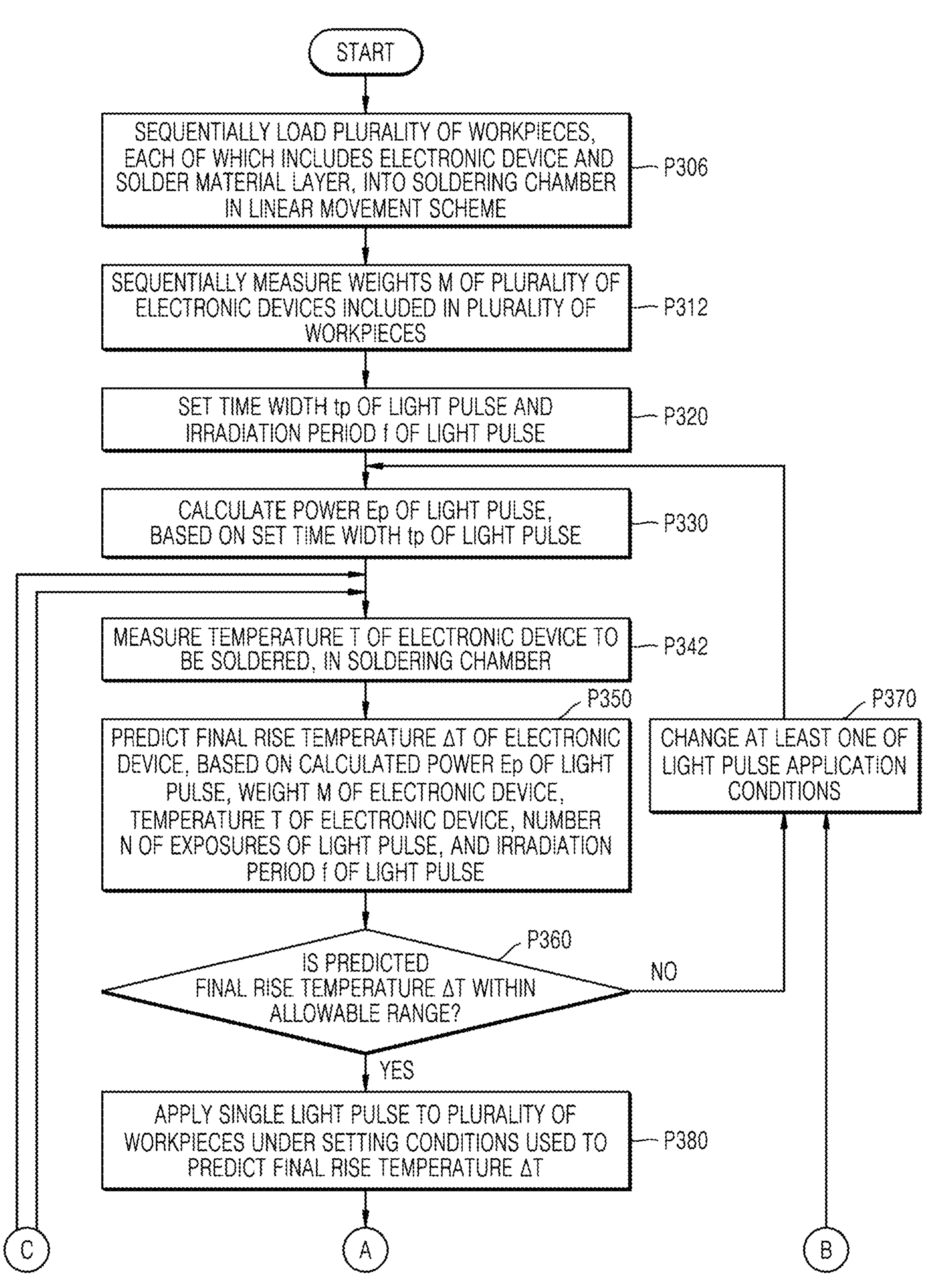
FIGS. 10A and 10B are flowcharts of a soldering method according to some example embodiments.
Figure 10B:
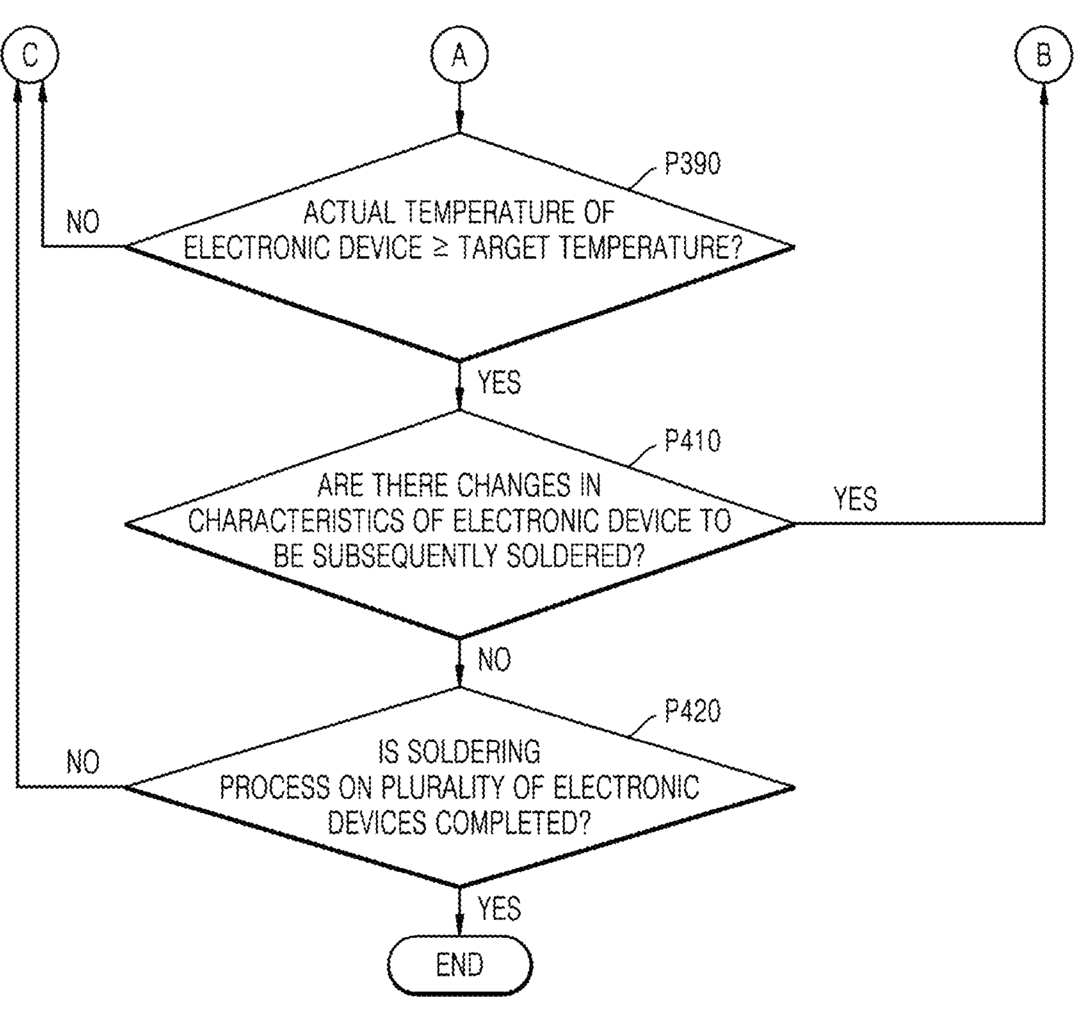

FIGS. 10A and 10B are flowcharts of a soldering method according to some example embodiments. In some example embodiments, including the example embodiments shown in FIGS. 10A and 10B, an example of performing a soldering process by using the soldering device 100 shown in FIG. 2 is described (e.g., based on operation of the control unit 190 to control the soldering device 100 and/or portions thereof, for example based on a processor of the control unit 190 executing a program of instructions stored at a memory of the control unit 190). However, the example embodiments are not limited thereto. For example, the soldering method shown in FIGS. 10A and 10B may be performed by using the soldering device 100 shown in FIG. 2, the soldering device 200 shown in FIG. 7, or a soldering device that is variously modified and changed within the scope of the inventive concepts.

Referring to FIGS. 2 and 10A, in process P306, a plurality of workpieces WP may be loaded into the soldering chamber 102 including the pulsed light irradiator 150 in the transfer device 110 in a linear movement scheme (e.g., along an axis extending in a particular direction). Each of the plurality of workpieces WP may include the main substrate 130, the electronic device 140 on the main substrate 130, and the solder material layer 134 between the main substrate 130 and the electronic device 140.

In process P312 of FIG. 10A, weights M of the plurality of electronic devices 140 included in the plurality of workpieces WP may be sequentially measured in a linear movement scheme (e.g., along an axis extending in a particular direction). Details of a method of performing process P312 may be the same as those of process P310 described with reference to FIG. 8.

Process P320, process P330, process P342, process P350, and process P360 of FIG. 10A may be performed in a manner similar to process P320, process P330, process P340, process P350, and process P360, which are described with reference to FIG. 8. Process P342 of FIG. 10A may be the same as process P340 of FIG. 8 except that a temperature T of the electronic device 140 to be subsequently soldered, from among the plurality of electronic devices 140 included in the plurality of workpieces WP, is measured. At least one electronic device 140 to be soldered may be provided. That is, one electronic device 140 to be soldered or a plurality of electronic devices 140 to be soldered may be provided. When there are (e.g., in response to a determination that there are) a plurality of electronic devices 140 to be soldered, the temperature T measured in process P342 may be determined (e.g., by the control unit 190) to be an average value of measured temperatures of the plurality of electronic devices 140.

When it is determined (e.g., in response to a determination) in process P360 of FIG. 10A that a predicted final rise temperature ΔT of the electronic device 140 deviates from (e.g., is outside) an allowable range, process P370 may be performed. When it is determined (e.g., in response to a determination) in process P360 that the predicted final rise temperature ΔT of the electronic device 140 included in each of the plurality of workpieces WP is within an allowable range, in process P380, a single light pulse may be applied to the plurality of workpieces WP by using the pulsed light irradiator 150 under setting conditions used to predict the final rise temperature ΔT.

In process P390 of FIG. 10B, an actual temperature of the plurality of electronic devices 140 may be calculated or measured by using the temperature sensor 170 located in the soldering chamber 102, and it may be determined whether the actual temperature of the electronic device 140 is higher than or equal to a target temperature. Herein, the actual temperature of the electronic device 140 may be an average value of actual temperatures of the plurality of electronic devices 140 on which the soldering process is simultaneously performed. Details of process P390 may be the same as those described with reference to FIG. 8. When it is determined (e.g., in response to a determination) in process P390 of FIG. 10B that the actual temperature of the electronic device 140 or the average value of the actual temperatures of the plurality of electronic devices 140 is higher than or equal to a target temperature, in process P410 of FIG. 10B, it may be determined whether characteristics of the electronic device 140 to be subsequently soldered, which is newly loaded into the soldering chamber 102, are different from characteristics of the electronic device 140 on which the soldering process was performed immediately before. When it is determined (e.g., in response to a determination) in process P410 of FIG. 10B that there are changes in characteristics of the electronic device 140 to be subsequently soldered, which is newly loaded into the soldering chamber 102, process P370 may be performed. When it is determined (e.g., in response to a determination) in process P410 of FIG. 10B that there are no changes in the characteristics of the electronic device 140 to be subsequently soldered, which is newly loaded into the soldering chamber 102, in process P420, processes according to the flowcharts shown in FIGS. 10A and 10B may be performed until it is determined that the soldering process on the plurality of workpieces WP to be soldered is completed.

Detailed operations and effects of the soldering method described with reference to FIGS. 10A and 10B may be the same as those of the soldering method described with reference to FIG. 8.

FIGS. 11A, 11B, 11C, and 11D are cross-sectional views of a process sequence of a method of manufacturing a semiconductor package, according to some example embodiments.

Figure 11A:
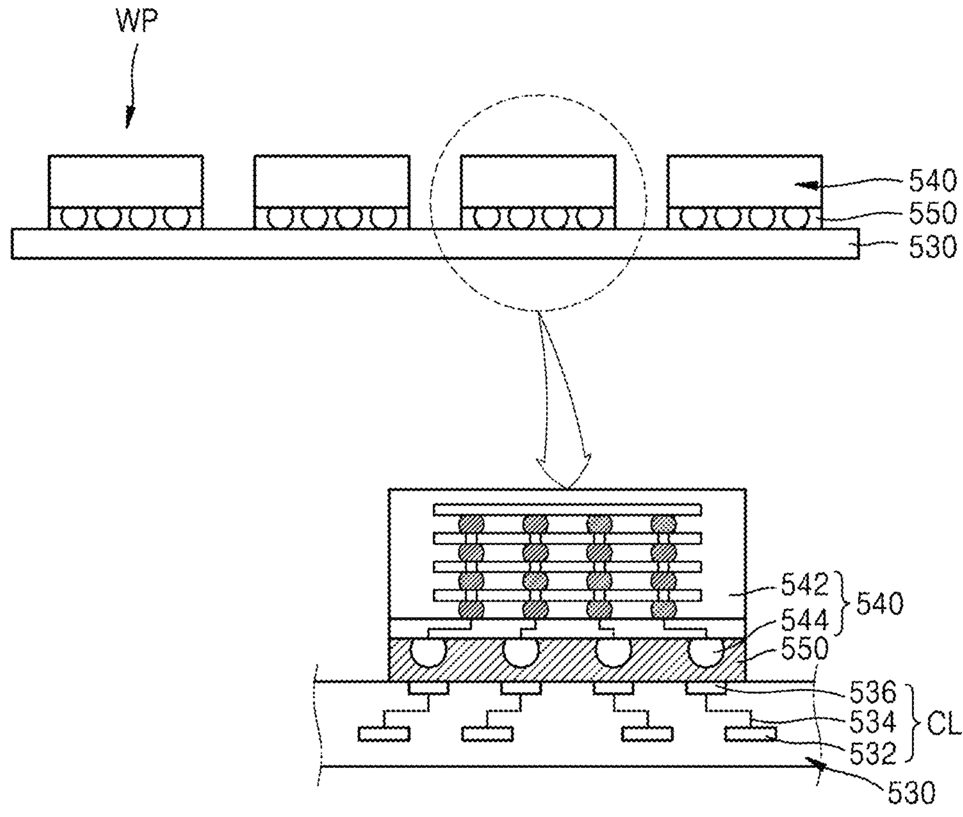
FIGS. 11A, 11B, 11C, and 11D are cross-sectional views of a process sequence of a method of manufacturing a semiconductor package, according to some example embodiments.

Referring to FIG. 11A, a plurality of electronic devices 540 may be arranged on a main substrate 530. The main substrate 530 may be a PCB, a carrier substrate, or a wafer, without being limited thereto. The electronic device 540 may include a main body 542 and a plurality of connection terminals 544 on one surface of the main body 542.

In some example embodiments, the main substrate 530 may be a wafer on which a redistribution layer including a fan-out wiring is formed. Hereinafter, an example in which the main substrate 530 is a wafer including the redistribution layer is described. A redistribution layer CL may be provided on an upper surface of the main substrate 530. The redistribution layer CL may include a lower terminal 532, an upper terminal 536, and a wiring structure 534. The wiring structure 534 may electrically connect the lower terminal 532 to the upper terminal 536. The upper terminal 536 may be exposed at the upper surface of the main substrate 530. Although the lower terminal 532 is illustrated as being in the main substrate 530 in FIG. 11A, the lower terminal 532 may be exposed at a lower surface of the main substrate 530. A plurality of upper terminals 536 included in the main substrate 530 may be at positions corresponding to the plurality of connection terminals 544 included in the electronic device 540.

The electronic device 540 may be adhered to the main substrate 530 by interposing an adhesive member 550 therebetween. The adhesive member 550 may include a non-conductive film (NCF), an anisotropic conductive film (ACF), an instant adhesive, an ultrasonically curable adhesive, or non-conductive paste (NCP), without being specifically limited.

As shown in FIG. 11A, the plurality of connection terminals 544 included in the electronic device 540 may be buried in the adhesive member 550 and spaced a particular (or, alternatively, predetermined) distance apart from the upper surface of the main substrate 530. In some example embodiments, the plurality of connection terminals 544 may be in contact with the upper surface of the main substrate 530. As used herein, a resultant structure in which the electronic device 540 are adhered onto the main substrate 530 may be referred to as a workpiece WP.

Figure 11B:
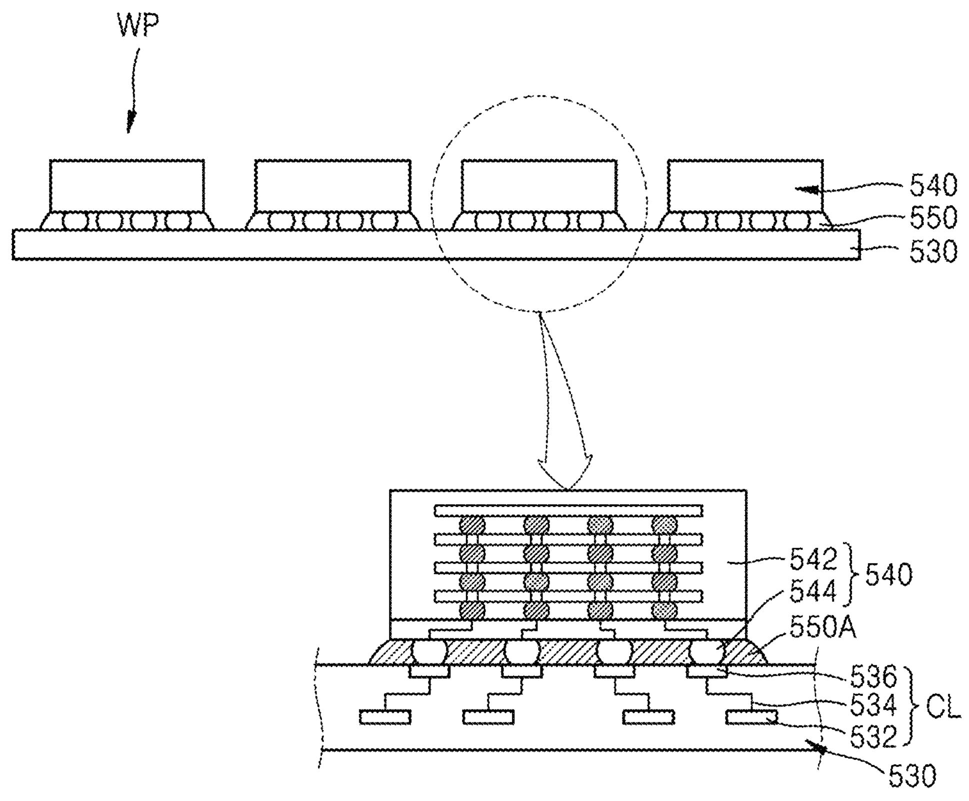

Referring to FIG. 11B, the electronic device 540 may be bonded to the main substrate 530, and thus, the plurality of connection terminals 544 may be electrically connected to the plurality of upper terminals 536 included in the main substrate 530. The process of bonding the electronic device 540 to the main substrate 530 may be performed by using at least one pulsed light irradiator 150 in the soldering chamber 102 of the soldering device 100 described with reference to FIG. 2, the soldering chamber 202 of the soldering device 200 described with reference to FIG. 7, and in a soldering member that is variously modified and changed within the scope of the inventive concepts. The process of bonding the electronic device 540 to the main substrate 530 may include heating the workpiece WP shown in FIG. 11A by applying light pulses from at least one pulsed light irradiator 150 according to a selected one or combination of the soldering methods described with reference to FIGS. 8, 9, 10A, and 10B.

During the process of bonding the electronic device 540 to the main substrate 530, the adhesive member 550 shown in FIG. 11A may be melted, cured, and modified into an adhesive member 550A having a shape that widens toward the main substrate 530. After the electronic device 540 is bonded to the main substrate 530, a distance between an uppermost surface and a lowermost surface of the adhesive member 550A may become less than before the bonding process described with reference to FIG. 11B is performed. The workpiece WP on which the bonding process is completely performed may be unloaded out of the soldering chamber 102.

Figure 11C:
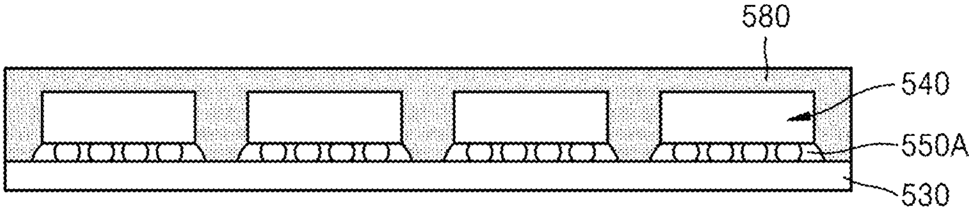

Referring to FIG. 11C, a molding process may be performed to form a molding resin layer 580 covering the plurality of electronic devices 540 bonded onto the main substrate 530.

The molding resin layer 580 may be deformed while having elasticity by force applied from the outside, and have flexibility. The molding resin layer 580 may include an EMC. The molding resin layer 580 may include a polymer material of which fluidity may be increased with a rise in temperature. The molding resin layer 580 may include a material film in which an epoxy resin is used as a matrix component and a component (e.g., a phenolic resin) capable of crosslinking with the epoxy resin is further added. The molding resin layer 580 may further include an elastomer component for giving elasticity thereto.

The epoxy resin may include at least one resin selected from a triphenylmethane type, a cresol novolak type, a biphenyl type, a bisphenol A type, a modified bisphenol A type, a bisphenol F type, a modified bisphenol F type, a dicyclopentadiene type, and a phenol novolak type, without being limited thereto.

The component capable of crosslinking with the epoxy resin may include a phenol novolak resin, a phenol aralkyl resin, a biphenyl aralkyl resin, a dicyclopentadiene-type phenol resin, a cresol novolak resin, a resol resin, or any combination thereof, without being limited thereto.

The elastomer component may include isoprene rubber, an ethylene-vinyl acetate copolymer, styrene-butadiene rubber, butadiene rubber, a styreneacrylate copolymer, an acrylic copolymer (e.g., polyacrylate ester), acrylonitrile rubber, or any combination thereof, without being limited thereto.

Figure 11D:
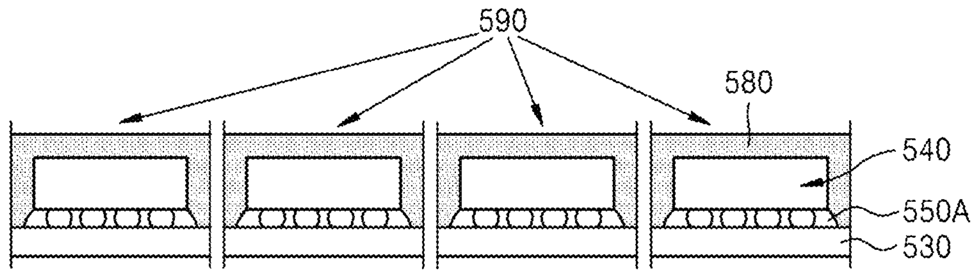

Referring to FIG. 11D, a dicing process may be performed to isolate the plurality of electronic devices 540 bonded onto the main substrate 530 to form semiconductor packages 590.

In some example embodiments, before the dicing process is performed, a process of thinning the lower surface of the main substrate 530 may be performed. In particular, as described with reference to FIG. 11A, when a plurality of lower terminals 532 are not exposed to the outside in the redistribution layer CL, the lower surface of the main substrate 530 may be thinned until the plurality of lower terminals 532 are exposed to the outside in the redistribution layer CL. In some example embodiments, after the thinning process, a process of forming conductive members including an under bump metal (UBM) on the lower surface of the main substrate 530 may be further performed. In some example embodiments, a process of forming solder bumps on the plurality of lower terminals 532, which are exposed at the lower surface of the main substrate 530, or on the conductive members may be further performed.

The dicing process may be performed by using a blade sawing method, a laser sawing method, or a plasma sawing method, without being limited thereto.

FIGS. 12A, 12B, 12C, and 12D are cross-sectional views of a process sequence of a method of manufacturing a semiconductor package, according to some example embodiments. In FIGS. 12A to 12D, the same reference numerals are used to denote the same elements as in FIGS. 11A to 11D, and thus, detailed descriptions thereof are omitted.

Figure 12A:
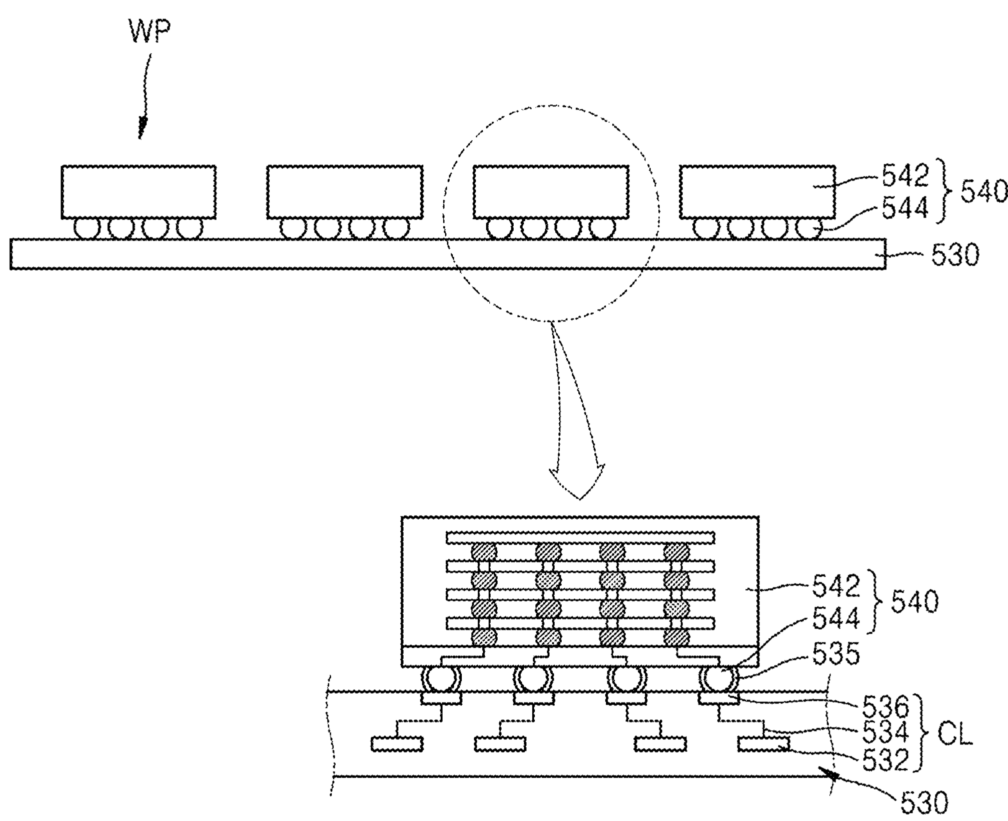
FIGS. 12A, 12B, 12C, and 12D are cross-sectional views of a process sequence of a method of manufacturing a semiconductor package, according to some example embodiments.

Referring to FIG. 12A, a plurality of electronic devices 540 may be arranged on a main substrate 530. The workpiece WP of FIG. 12A may substantially be the same as the workpiece WP of FIG. 11A except that the adhesive member 550 is not included.

Surfaces of the plurality of connection terminals 544 included in the electronic device 540 may be coated with a flux 535. The flux 535 may be provided to the surfaces of the plurality of connection terminals 544 before the plurality of electronic devices 540 are arranged on the main substrate 530.

In some example embodiments, the flux 535 may include a mixture of a solvent, a base resin, a thixotropic agent, and an activator. In some example embodiments, the flux 535 may include the solvent in an amount of about 30 weight % (wt %) to about 60 wt %, the base resin in an amount of about 0.5 wt % to about 60 wt %, the thixotropic agent in an amount of about 1 wt % to about 20 wt %, and the activator in an amount of about 0.1 wt % to about 20 wt %, based on the total weight of the flux 535, without being limited thereto.

The solvent that may be included in the flux 535 may include, for example, diethylene glycol monohexyl ether, diethylene glycol monobutyl ether, diethylene glycol monobutyl ether acetate, tetraethylene glycol, 2-ethyl-1,3-hexanediol, and α-terpineol.

The base resin that may be included in the flux 535 may include a rosin, an acryl resin, or a mixture thereof. The rosin may include a gum rosin, a tall rosin, a wood rosin, a polymerized rosin, a hydrogenated rosin, a formylated rosin, an ester rosin, a rosin-modified maleic acid resin, a rosin-modified phenolic resin, and a rosin-modified alkyd resin.

The thixotropic agent that may be included in the flux 535 may include hydrogenated castor oil, fatty acid amide, natural fat, synthetic fat, N,N'-ethylenebis-12-hydroxystearylamide, 12-hydroxystearic acid, 1,2,3,4-dibenzylidene-D-sorbitol, and derivatives thereof.

The activator that may be included in the flux 535 may include a hydrohalic acid amine salt. For example, the activator may include hydrochloric acid salts or hydrobromic acid salts of amines, such as triethanolamine, diphenyl guanidine, ethanolamine, butylamine, aminopropanol, polyoxyethylene oleylamine, polyoxyethylene laurelamine, polyoxyethylene stearylamine, diethylamine, triethylamine, methoxypropylamine, dimethylaminopropylamine, dibutylaminopropylamine, ethylhexylamine, ethoxypropylamine, ethylhexyl oxypropylamine, bispropylamine, isopropylamine, diisopropylamine, piperidine, 2,6-dimethylpiperidine, aniline, methylamine, ethylamine, 3-amino-1-propene, dimethylhexylamine, and cyclocyclohexylamine.

Figure 12B:
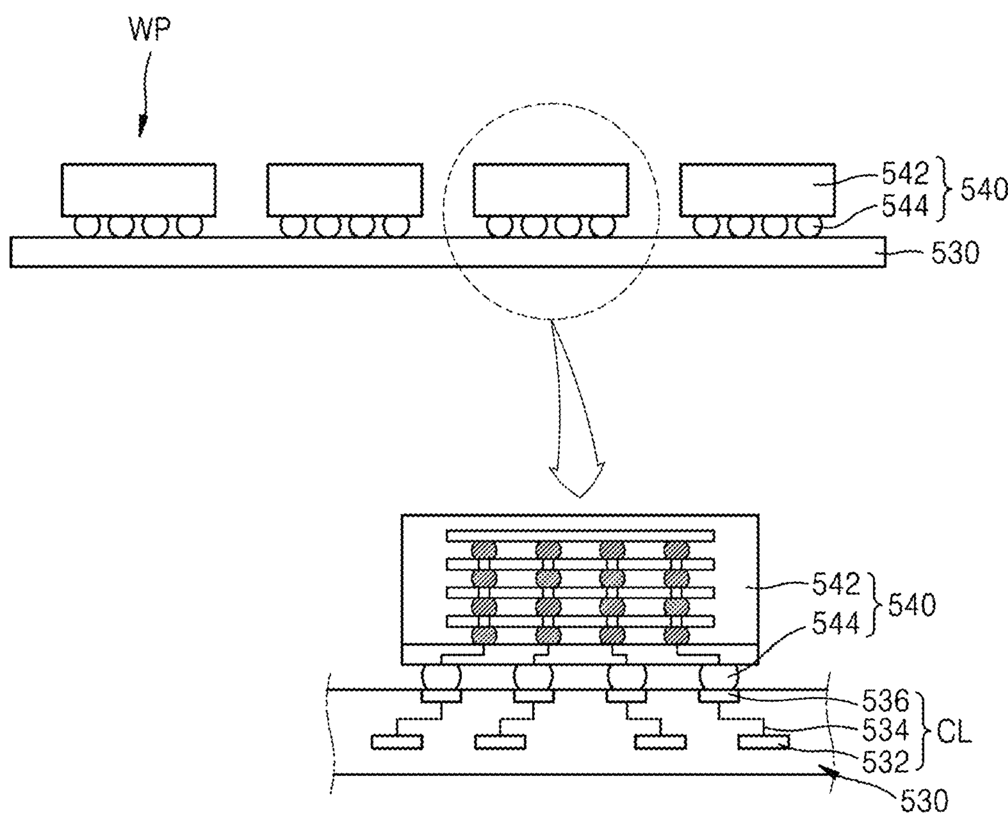

Referring to FIG. 12B, the electronic device 540 may be bonded to the main substrate 530, and thus, the plurality of connection terminals 544 may be electrically connected to the plurality of upper terminals 536 included in the main substrate 530. There may be no adhesive member (e.g., the adhesive member 550 shown in FIGS. 11A and 11B) between the main substrate 530 and the plurality of electronic devices 540.

The process of bonding the electronic device 540 to the main substrate 530 may be performed by using at least one pulsed light irradiator 150 in the soldering chamber 102 of the soldering device 100 described with reference to FIG. 2, the soldering chamber 202 of the soldering device 200 described with reference to FIG. 7, and in a soldering member that is variously modified and changed within the scope of the inventive concepts. The process of bonding the electronic device 540 to the main substrate 530 may include heating the workpiece WP shown in FIG. 11A by applying light pulses from the at least one pulsed light irradiator 150 according to a selected one or combination of the soldering methods described with reference to FIGS. 8, 9, 10A, and 10B.

Figure 12C:
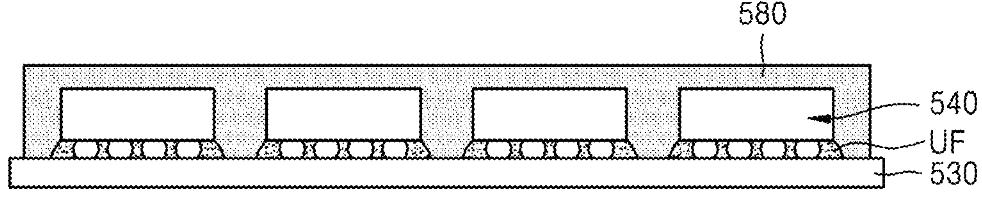

Referring to FIG. 12C, an underfill material layer UF may be formed between the electronic device 540 and the main substrate 530 to fill respective spaces between the plurality of connection terminals 544, and a molding process for forming a molding resin layer 580 to cover the plurality of electronic devices 540 bonded onto the main substrate 530 may be performed.

The underfill material layer UF may include an epoxy. The underfill material layer UF may include filler particles including silicon or glass.

Figure 12D:
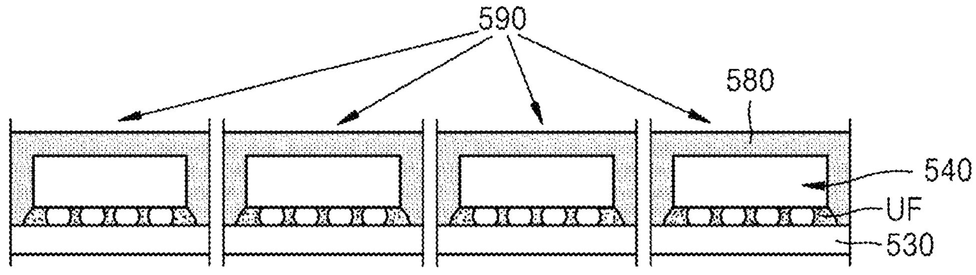

Referring to FIG. 12D, a dicing process for isolating the plurality of electronic devices 540 bonded onto the main substrate 530 to form semiconductor packages 590 may be performed.

Although methods of manufacturing semiconductor packages, according to some example embodiments, have been described with reference to FIGS. 11A to 11D and 12A to 12D, the methods may be variously modified and changed within the scope of the inventive concepts. For example, in the bonding process described with reference to FIGS. 11B and 12B, solder paste, a solder ball, a solder bump, flux, or any combination thereof may be used as a soldering target. Furthermore, a soldering method and a method of manufacturing a semiconductor package, according to some example embodiments, may be used to manufacture all various semiconductor package products (e.g., a flip-chip package, a BGA package, a lead frame package, and a QFP), which are obtained by performing a soldering process for a connection structure configured to transmit and receive electrical signals.

In some example embodiments, a method for manufacturing a manufactured electronic device may include performing one or more operations that include incorporating one or more of the semiconductor packages 590 into the assembly of the manufactured electronic device as one or more components thereof. A manufactured electronic device may include, for example, a computing device, a smartphone, a computer, a laptop, a camera, any combination thereof, or the like. For example, the method may include incorporating one or more of the semiconductor packages 590 as one or more components of the manufactured electronic device (e.g., as part of a processing circuitry, a processor, a memory, a transceiver, a power supply, any combination thereof, or the like).

While the inventive concepts have been particularly shown and described with reference to some example embodiments thereof, it will be understood that various changes in form and details may be made therein without departing from the spirit and scope of the following claims.

What is claimed is:

1. A soldering method, comprising:

loading a workpiece into a soldering chamber comprising at least one pulsed light irradiator, the workpiece comprising a main substrate, an electronic device on the main substrate, and a solder material layer between the main substrate and the electronic device;

setting a time width of a light pulse from the at least one pulsed light irradiator and an irradiation period of the light pulse;

calculating a power of the light pulse based on the time width of the light pulse to determine a calculated power;

measuring a temperature of the electronic device in the soldering chamber to determine a measured temperature;

predicting a final rise temperature of the electronic device, based on the calculated power of the light pulse, a weight of the electronic device, the measured temperature of the electronic device, a quantity of exposures of the light pulse to the electronic device, and the irradiation period of the light pulse to determine a predicted final rise temperature; and changing at least one of the power of the light pulse, the time width of the light pulse, or the irradiation period of the light pulse in response to a determination that the predicted final rise temperature of the electronic device deviates from a particular temperature range.

2. The soldering method of claim 1, wherein the solder material layer comprises solder paste, solder balls, solder bumps, flux, or any combination thereof.

3. The soldering method of claim 1, further comprising applying a single light pulse to the workpiece under setting conditions used to predict the final rise temperature of the electronic device, by using the at least one pulsed light irradiator, in response to a determination that the predicted final rise temperature of the electronic device is within the particular temperature range.

4. The soldering method of claim 1, wherein the calculating of the power of the light pulse comprises calculating a power Ep of the light pulse according to Equation 1:

$$E_P = \frac{V^3 t_P}{K_0^2} \quad \text{[Equation 1]}$$

wherein, in Equation 1,

V denotes a charging voltage of the at least one pulsed light irradiator, tp denotes the time width of the light pulse, and $K_0$ denotes an impedance of the at least one pulsed light irradiator, wherein the predicting the final rise temperature of the electronic device comprises predicting a final rise temperature ΔT of the electronic device according to Equation 2:

$$\Delta T = \sum_{n=1}^{N} \frac{E_P}{cM} - (aT + b)(1/f) \quad \text{[Equation 2]}$$

wherein, in Equation 2, c denotes a specific heat of the electronic device,

M denotes the weight of the electronic device,

T denotes the temperature of the electronic device, which is measured in real time in the soldering chamber immediately before subsequent irradiation of pulsed light, f denotes the irradiation period of the light pulse, each of a and b denotes a particular constant that determines a temperature attenuation function represented by "aT+b," and N denotes the quantity of exposures of light pulses to the electronic device.

5. The soldering method of claim 1, wherein the at least one pulsed light irradiator irradiates intense pulsed light (IPL).

6. A method of manufacturing a semiconductor package, the method comprising:

forming a plurality of workpieces based on arranging a plurality of electronic devices on the main substrate; and bonding the plurality of electronic devices onto the main substrate based on using the soldering method of claim 5.

7. The soldering method of claim 1, further comprising, in response to a determination that the predicted final rise temperature of the electronic device is within the particular temperature range, applying a single light pulse to the workpiece under setting conditions used to predict the final rise temperature of the electronic device by using the at least one pulsed light irradiator and repeating the applying of the single light pulse to the workpiece a plurality of times, wherein the measuring of the temperature of the electronic device is performed each time the single light pulse is applied to the workpiece.

8. The soldering method of claim 7, wherein the solder material layer comprises solder paste comprising tin (Sn) and silver (Ag).

9. The soldering method of claim 1, further comprising:

applying a single first light pulse to the workpiece under setting conditions used to predict the final rise temperature of the electronic device, by using the at least one pulsed light irradiator, in response to a determination that the predicted final rise temperature of the electronic device is within the particular temperature range;

re-measuring the temperature of the electronic device in the soldering chamber after the single first light pulse is applied to the workpiece to determine a re-measured temperature;

re-predicting the final rise temperature of the electronic device, based on the re-measured temperature of the electronic device to determine a re-predicted final rise temperature; and applying a single second light pulse to the workpiece under setting conditions used to re-predict the final rise temperature of the electronic device, by using the at least one pulsed light irradiator, in response to a determination that the re-predicted final rise temperature of the electronic device is within the particular temperature range.

10. The soldering method of claim 9, wherein the single first light pulse and the single second light pulse are applied to the workpiece under a condition that at least one selected from a power of the single second light pulse and a time width of the single second light pulse has a same value as a corresponding at least one of a power of the single first light pulse and a time width of the single first light pulse.

11. The soldering method of claim 9, wherein the single first light pulse and the single second light pulse are applied to the workpiece under a condition that at least one selected from a power of the single second light pulse and a time width of the single second light pulse has a different value than a corresponding at least one of a power of the single first light pulse and a time width of the single first light pulse.

12. The soldering method of claim 9, wherein:

the soldering chamber comprises a plurality of soldering zones arranged in a line in a direction in which a transfer device is configured to move, and a plurality of pulsed light irradiators in separate, respective soldering zones of the plurality of soldering zones, and the soldering method further comprises:

a first operation of applying a single light pulse to the workpiece under setting conditions used to predict the final rise temperature of the electronic device, by using a selected one pulsed light irradiator of the plurality of pulsed light irradiators in a selected one soldering zone of the plurality of soldering zones, in response to a determination that the predicted final rise temperature of the electronic device is within the particular temperature range, a second operation of re-measuring the temperature of the electronic device in the soldering chamber after the single light pulse is applied to the workpiece;

a third operation of re-predicting the final rise temperature of the electronic device, based on the re-measured temperature of the electronic device; and sequentially repeating the first operation, the second operation, and the third operation.

13. A soldering method, comprising:

sequentially loading a plurality of workpieces into a soldering member comprising at least one pulsed light irradiator in a linear movement scheme, each workpiece of the plurality of workpieces including a main substrate, an electronic device on the main substrate, and a solder material layer between the main substrate and the electronic device;

setting a time width of a light pulse irradiated from the at least one pulsed light irradiator and an irradiation period of the light pulse;

calculating a power Ep of the light pulse according to Equation 1:

$$E_P = \frac{V^3 t_P}{K_0^2} \quad \text{[Equation 1]}$$

wherein, in Equation 1,

V denotes a charging voltage of the at least one pulsed light irradiator, tp denotes the time width of the light pulse, and $K_0$ denotes an impedance of the at least one pulsed light irradiator;

measuring a temperature of the electronic device comprised in each of the plurality of workpieces in a soldering chamber;

predicting a final rise temperature ΔT of the electronic device to determine a predicted final rise temperature ΔT of the electronic device according to Equation 2:

$$\Delta T = \sum_{n=1}^{N} \frac{E_P}{cM} - (aT + b)(1/f) \quad \text{[Equation 2]}$$

wherein, in Equation 2, c denotes a specific heat of the electronic device,

M denotes a weight of the electronic device,

T denotes the temperature of the electronic device, which is measured in real time in the soldering chamber immediately before subsequent irradiation of pulsed light, f denotes the irradiation period of the light pulse, each of a and b denotes a particular constant that determines a temperature attenuation function represented by "aT+b," and N denotes a quantity of exposures of light pulses to the electronic device;

changing at least one of the power Ep of the light pulse, the time width tp of the light pulse, or the irradiation period f of the light pulse in response to a determination that the predicted final rise temperature ΔT of the electronic device deviates from a particular temperature range to produce at least one changed value; and applying a single light pulse to each of the plurality of workpieces by using the at least one pulsed light irradiator under setting conditions used to predict the final rise temperature ΔT of the electronic device, in response to a determination that the predicted final rise temperature ΔT of the electronic device is within the particular temperature range.

14. The soldering method of claim 13, wherein the at least one pulsed light irradiator is configured to irradiate intense pulsed light (IPL).

15. The soldering method of claim 13, further comprising:

changing at least one value of the power Ep of the light pulse, the time width tp of the light pulse, and the irradiation period f of the light pulse in response to a determination that characteristics of the electronic device in a selected one workpiece of the plurality of workpieces are different from characteristics of the electronic device to which the light pulse is applied immediately before;

measuring a temperature of the electronic device in the selected one workpiece;

re-predicting the final rise temperature ΔT of the electronic device comprised in the selected one workpiece according to Equation 2, based on the at least one changed value and the temperature of the electronic device comprised in the selected one workpiece; and applying another single light pulse to the selected one workpiece by the at least one pulsed light irradiator under setting conditions used to re-predict the final rise temperature ΔT of the electronic device in the selected one workpiece, when the final rise temperature ΔT of the electronic device comprised in the selected one workpiece is within the particular temperature range.

* * * * *